United States Patent
Kim et al.

(10) Patent No.: US 11,238,954 B2
(45) Date of Patent: Feb. 1, 2022

(54) NONVOLATILE MEMORY DEVICE, STORAGE DEVICE INCLUDING NONVOLATILE MEMORY DEVICES, AND METHOD OF TRAINING DATA INPUT AND OUTPUT LINES BETWEEN CONTROLLER AND NONVOLATILE MEMORY DEVICES

(71) Applicant: Samsung Electronics Co., Ltd., Suwon-si (KR)

(72) Inventors: Jongmin Kim, Seoul (KR); Yeongjin Seo, Yongin-si (KR); Keun-Hwan Lee, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/998,068

(22) Filed: Aug. 20, 2020

(65) Prior Publication Data

US 2020/0381075 A1 Dec. 3, 2020

Related U.S. Application Data

(63) Continuation of application No. 15/995,461, filed on Jun. 1, 2018, now Pat. No. 10,755,797.

(30) Foreign Application Priority Data

Oct. 23, 2017 (KR) .................. 10-2017-0137417

(51) Int. Cl.
*G11C 29/50* (2006.01)
*G11C 29/12* (2006.01)
(Continued)

(52) U.S. Cl.
CPC ........ *G11C 29/50012* (2013.01); *G06F 12/00* (2013.01); *G11C 29/023* (2013.01);
(Continued)

(58) Field of Classification Search
CPC . G11C 29/023; G11C 29/028; G11C 29/1201; G11C 29/12015; G11C 29/50012; G11C 2029/4402; G06F 12/00–16
See application file for complete search history.

(56) References Cited

U.S. PATENT DOCUMENTS 8,170,067 B2 5/2012 Zerbe et al.
8,588,014 B1 11/2013 Fung et al.
(Continued)

FOREIGN PATENT DOCUMENTS

KR 2006/0134980 A 12/2006
KR 2009/0041461 A 4/2009
KR 2017/0081126 A 7/2017

*Primary Examiner* — Nicholas J Simonetti
(74) *Attorney, Agent, or Firm* — Harness, Dickey & Pierce, P.L.C.

(57) ABSTRACT

A storage device includes a plurality of nonvolatile memory devices; and a controller connected in common to the plurality of nonvolatile memory devices through data lines, the controller being configured to detect first offset information by performing a first training operation with respect to a first nonvolatile memory device from among the plurality of nonvolatile memory devices, the controller being further configured to, based on the first offset information, perform a second training operation with respect to a second nonvolatile memory device from among the plurality of nonvolatile memory devices.

20 Claims, 22 Drawing Sheets

(51) Int. Cl.
   *G11C 29/02* (2006.01)
   *G06F 12/00* (2006.01)
   *G11C 29/44* (2006.01)

(52) U.S. Cl.
   CPC ........ *G11C 29/028* (2013.01); *G11C 29/1201* (2013.01); *G11C 29/12015* (2013.01); *G11C 2029/4402* (2013.01)

(56) References Cited

U.S. PATENT DOCUMENTS

| | | | |
|---|---|---|---|
| 8,593,901 B2 | 11/2013 | Oh et al. | |
| 8,692,561 B2 | 4/2014 | Cordero et al. | |
| 9,285,828 B2 | 3/2016 | Shoev et al. | |
| 9,646,675 B1 | 5/2017 | Lee | |
| 10,033,524 B1* | 7/2018 | Siddaiah | H04B 17/101 |
| 10,229,743 B1* | 3/2019 | Han | G11C 29/028 |
| 2006/0198229 A1* | 9/2006 | Choi | G11C 7/1075 |
| | | | 365/230.03 |
| 2010/0082967 A1 | 4/2010 | Lo | |
| 2010/0325372 A1 | 12/2010 | Housty et al. | |
| 2013/0159615 A1* | 6/2013 | Brandl | G06F 13/1689 |
| | | | 711/105 |
| 2014/0317334 A1* | 10/2014 | Gadsing | G06F 13/1689 |
| | | | 711/103 |
| 2015/0364212 A1* | 12/2015 | Razzaz | G11C 29/023 |
| | | | 365/193 |
| 2015/0378956 A1* | 12/2015 | Dearth | G06F 13/28 |
| | | | 710/308 |
| 2016/0162404 A1* | 6/2016 | Lee | G11C 5/04 |
| | | | 711/120 |

\* cited by examiner

NONVOLATILE MEMORY DEVICE, STORAGE DEVICE INCLUDING NONVOLATILE MEMORY DEVICES, AND METHOD OF TRAINING DATA INPUT AND OUTPUT LINES BETWEEN CONTROLLER AND NONVOLATILE MEMORY DEVICES

CROSS-REFERENCE TO RELATED APPLICATIONS

This application is a continuation of and claims priority under 35 U.S.C. §§ 120/121 to U.S. patent application Ser. No. 15/995,461, filed Jun. 1, 2018, which claims priority under 35 U.S.C. § 119 to Korean Patent Application No. 10-2017-0137417 filed Oct. 23, 2017, in the Korean Intellectual Property Office, the entire contents of each of which are incorporated herein by reference.

BACKGROUND

1. Field

At least some example embodiments of the inventive concepts relate to a semiconductor memory, and in particular, to a nonvolatile memory device, a storage device including nonvolatile memory devices, and a method of training data input and output lines between a controller and the nonvolatile memory devices.

2. Related Art

The function of one semiconductor logic device is being improved as technologies for manufacturing the semiconductor logic device develop. In particular, as the function of the semiconductor logic device used as a memory controller is improved, a system in which one controller controls a plurality of semiconductor logic devices is being developed and used.

A controller and a memory device communicate with each other through data input and output lines. Training may be performed to improve the reliability of data transmission between the controller and the memory device through the data input and output lines. The training includes aligning transmission or arrival timings of pieces of data sent in parallel through the data input and output lines.

When one controller controls a plurality of memory devices, some memory devices may share the data input and output lines. If the data input and output lines are shared, the memory devices cannot be trained at the same time, and thus, the memory device are sequentially trained. In the case where the memory devices are sequentially trained by the controller, a delay may occur when the controller and the memory devices enters a ready state at power-on.

SUMMARY

According to at least one example embodiment of the inventive concepts, a storage device includes a plurality of nonvolatile memory devices; and a controller connected in common to the plurality of nonvolatile memory devices through data lines, the controller is configured to detect first offset information by performing a first training operation with respect to a first nonvolatile memory device from among the plurality of nonvolatile memory devices, and the controller is further configured to, based on the first offset information, perform a second training operation with respect to a second nonvolatile memory device from among the plurality of nonvolatile memory devices.

According to at least one example embodiment of the inventive concepts, a nonvolatile memory device includes a memory cell array including a plurality of memory blocks; an input-output circuit, the input-output circuit configured to receive data to be written in the memory cell array through data lines and to output data bits read from the memory cell array to an external device through the data lines; and a control logic circuit, wherein the control logic circuit is configured to control the input-output circuit to, store offset information received through the data lines, set first delays applied by the input-output circuit to data bits output by the input-output circuit through the data lines based on the offset information, and perform a first training operation that includes outputting data bits while adjusting the first delays.

According to at least one example embodiment of the inventive concepts, a method of training data lines between a controller and a plurality of nonvolatile memory devices includes detecting first offset information by performing, at the controller, a first training operation with a first nonvolatile memory device from among the plurality of nonvolatile memory devices; adjusting delays of data transmission between the controller and the first nonvolatile memory device depending on the first offset information; performing, at the controller, a second training operation with a second nonvolatile memory device of the plurality of nonvolatile memory devices based on the first offset information to detect second offset information; and adjusting delays of data transmission between the controller and the second nonvolatile memory device depending on the second offset information.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
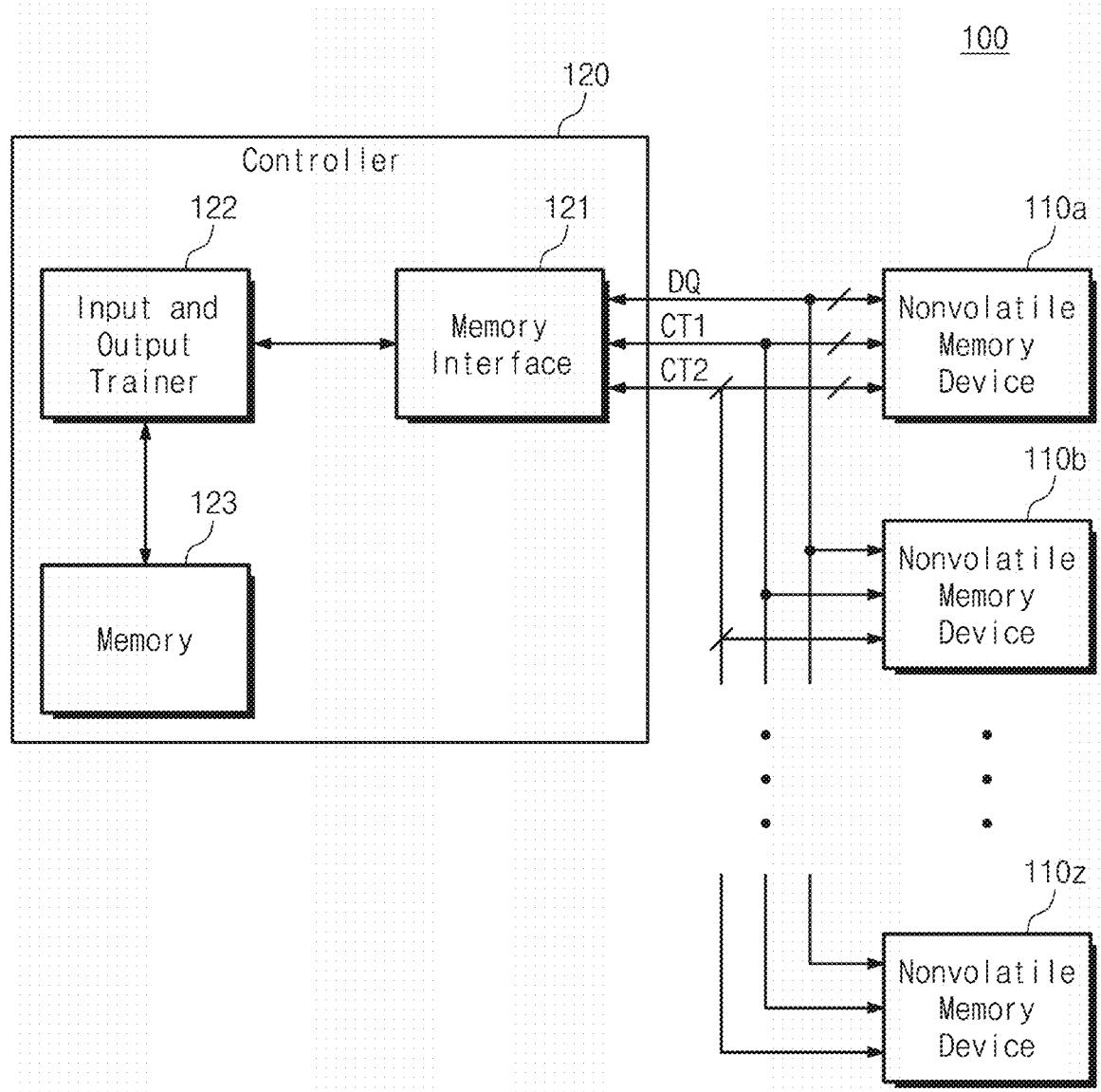
FIG. 1 is a block diagram illustrating a storage device according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a storage device 100 according to at least some example embodiments of the inventive concepts. Referring to FIG. 1, the storage device 100 includes a plurality of nonvolatile memory devices 110$a$ to 110$z$ and a controller 120. The nonvolatile memory devices 110$a$ to 110$z$ may include various memories such as a flash memory, a phase-change random access memory (PRAM), a magnetoresistive RAM (MRAM), a resistive RAM (RRAM), a ferroelectric RAM (FRAM), and the like.

The nonvolatile memory devices 110$a$ to 110$z$ may include homogeneous memories or heterogeneous memories. The nonvolatile memory devices 110$a$ to 110$z$ may communicate with the controller 120 through data input and output lines DQ, first control lines CT1, and second control lines CT2.

The data input and output lines DQ may be connected in common to the nonvolatile memory devices 110$a$ to 110$z$. For example, a signal (e.g., a data bit) that is sent from the controller 120 through one of the data input and output lines DQ may be provided in common to the nonvolatile memory devices 110$a$ to 110$z$.

The first control lines CT1 may be connected in common to the nonvolatile memory devices 110$a$ to 110$z$. For example, a signal (e.g., a control signal) that is sent from the controller 120 through one of the first control lines CT1 may be provided in common to the nonvolatile memory devices 110$a$ to 110$z$.

The second control lines CT2 may be individually connected to the nonvolatile memory devices 110$a$ to 110$z$. For example, the controller 120 and the nonvolatile memory device 110$a$ may be connected through at least one of the second control lines CT2. The controller 120 and the nonvolatile memory device 110$b$ may be connected through at least another of the second control lines CT2.

The controller 120 is configured to control the nonvolatile memory devices 110$a$ to 110$z$. The controller 120 may allow the nonvolatile memory devices 110$a$ to 110$z$ to perform a program, read, or erase operation. Also, the controller 120 may perform training with the nonvolatile memory devices 110$a$ to 110$z$.

The training may be performed after power is supplied to the storage device 100 or after the storage device 100 switches from a power saving mode to a normal mode. The training may be performed before the controller 120 controls the nonvolatile memory devices 110$a$ to 110$z$ normally (e.g., before the controller 120 allows the nonvolatile memory devices 110$a$ to 110$z$ to perform a program, read, or erase operation).

The controller 120 may perform training with each of the nonvolatile memory devices 110$a$ to 110$z$. For example, the controller 120 may perform training on the data input and output lines DQ with the nonvolatile memory device 110$a$. In the training operation, the controller 120 and the nonvolatile memory device 110$a$ may adjust timings to send data bits through data input and output lines DQ.

The controller 120 includes a memory interface 121, an input and output trainer 122, and a memory 123. The memory interface 121 may substantially perform communication with the nonvolatile memory devices 110$a$ to 110$z$. For example, the memory interface 121 may exchange signals having levels and timings defined by the specific protocol with the nonvolatile memory devices 110$a$ to 110$z$.

According to at least some example embodiments, the input and output trainer 122 may be, for example, a circuit or circuitry that performs training with the nonvolatile memory devices 110a to 110z through the memory interface 121. The input and output trainer 122 may also be occasionally referred to in the present disclosure as the input and output trainer circuit 122. The input and output trainer 122 may store pieces of information needing training or pieces of information (e.g., delays) obtained by training. The input and output trainer 122 may perform training with the nonvolatile memory devices 110a to 110z through the memory 123.

Figure 2:
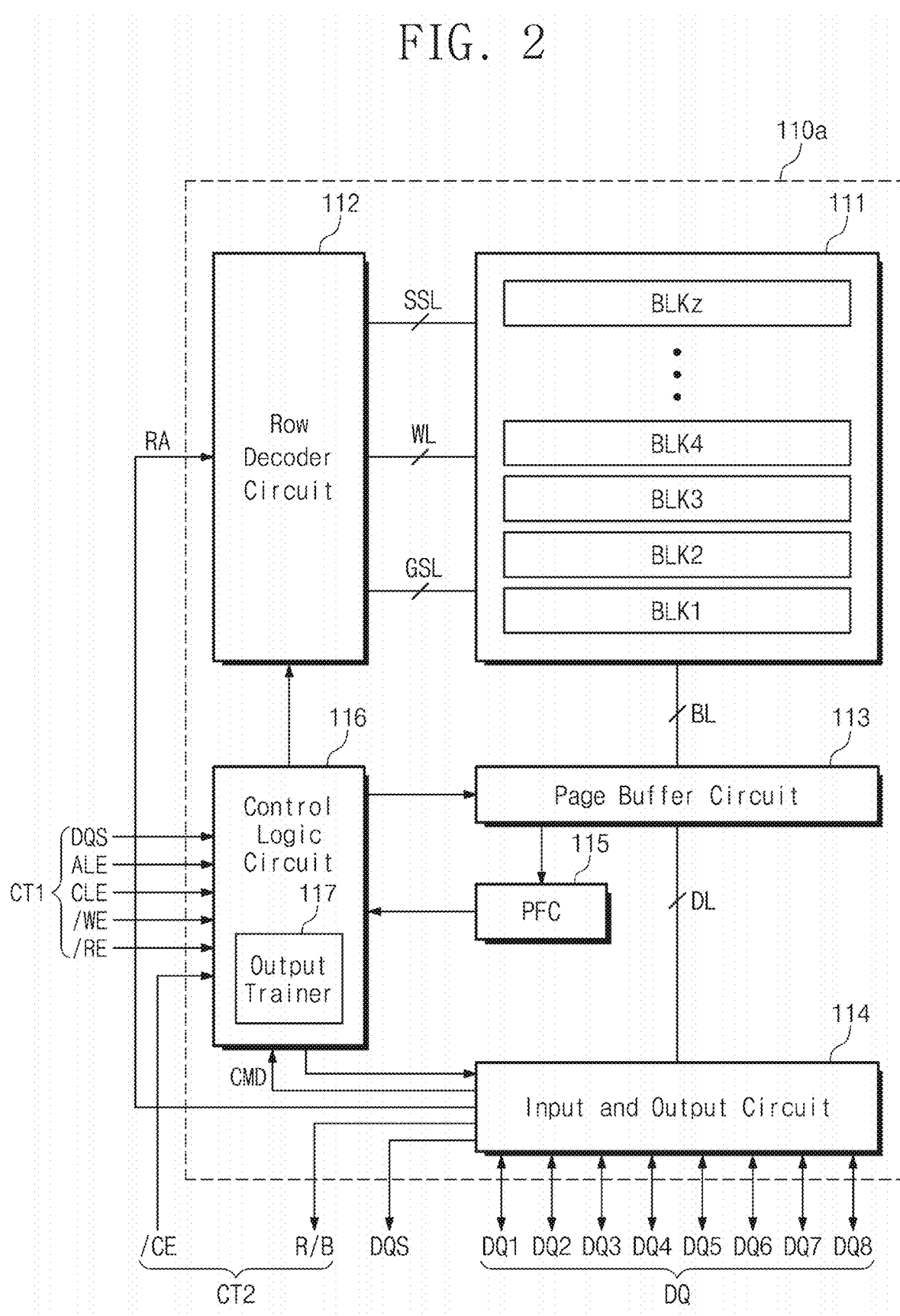
FIG. 2 is a block diagram illustrating a nonvolatile memory device according to at least some example embodiments of the inventive concepts.

FIG. 2 is a block diagram illustrating the nonvolatile memory device 110a according to at least some example embodiments of the inventive concepts. According to at least one example embodiment of the inventive concepts, components of the nonvolatile memory device 110a are illustrated in FIG. 2, but other nonvolatile memory devices 110b to 110z may also include the same components as illustrated in FIG. 2.

Referring to FIGS. 1 and 2, the nonvolatile memory device 110a includes a memory cell array 111, a row decoder circuit 112, a page buffer circuit 113, an input and output circuit 114, a pass-fail check circuit (PFC) 115, and a control logic circuit 116.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 112 through at least one ground selection line GSL, a plurality of word lines WL, and at least one string selection line SSL. Each of the memory blocks BLK1 to BLKz may be connected to the page buffer circuit 113 through a plurality of bit lines BL. The memory blocks BLK1 to BLKz may be connected in common to the bit lines BL.

According to at least one example embodiment of the inventive concepts, each of the memory blocks BLK1 to BLKz may correspond to a unit of an erase operation. The memory cells of the memory cell array 111 may be erased for each memory block. The memory cells belonging to one memory block may be erased at the same time. As another example, each of the memory blocks BLK1 to BLKz may be divided into a plurality of sub-blocks. Each sub-block may correspond to a unit of an erase operation.

The row decoder circuit 112 is connected to the memory cell array 111 through a plurality of ground selection lines GSL, the plurality of word lines WL, and a plurality of string selection lines SSL. The row decoder circuit 112 operates under control of the control logic circuit 116. The row decoder circuit 112 may receive a row address RA from the input and output circuit 114. The row decoder circuit 112 may decode the received row address and may control voltages to be applied to the string selection lines SSL, the word lines WL, and the ground selection lines GSL based on the decoded address.

The page buffer circuit 113 is connected to the memory cell array 111 through the bit lines BL. The page buffer circuit 113 is connected with the input and output circuit 114 through a plurality of data lines DL. The page buffer circuit 113 operates under control of the control logic circuit 116.

In a write operation, the page buffer circuit 113 may store data bits to be programmed in memory cells. The page buffer circuit 113 may apply voltages to the bit lines BL based on the stored data bits. For example, the page buffer circuit 113 may function as a write driver. In a read operation or a verification read operation, the page buffer circuit 113 may sense voltages of the bit lines BL and may store the sensed result. For example, the page buffer circuit 113 may function as a sense amplifier.

The input and output circuit 114 is connected with the page buffer circuit 113 through the data lines DL. The input and output circuit 114 may be connected with the controller 120 through data input and output lines DQ (e.g., DQ1 to DQ8). The data input and output lines DQ1 to DQ8 may also be referred to, on occasion, in the present disclosure as data lines DQ1 to DQ8. The input and output circuit 114 may also be referred to, on occasion, in the present disclosure as any of data input-output circuit 114, data input/output circuit 114, or data I/O circuit 114. The input and output circuit 114 may output data bits read by the page buffer circuit 113 to the controller 120 through the data input and output lines DQ1 to DQ8 and may send data bits received from the controller 120 through the data input and output lines DQ1 to DQ8 to the page buffer circuit 113.

The input and output circuit 114 may receive an address through the data input and output lines DQ1 to DQ8. The input and output circuit 114 may send the row address RA of the received address to the row decoder circuit 112. On the basis of a column address of the received address, the input and output circuit 114 may store data bits in the page buffer circuit 113 or may read data bits stored in the page buffer circuit 113.

The input and output circuit 114 may receive a command CMD through the data input and output lines DQ1 to DQ8. The input and output circuit 114 may send the received command CMD to the control logic circuit 116. The input and output circuit 114 may output a data strobe signal DQS to the controller 120. The input and output circuit 114 may output data bits through the data input and output lines DQ1 to DQ8 in synchronization with the data strobe signal DQS.

Below, for a brief description, signals that are received (input) or sent (output) through the data input and output lines DQ1 to DQ8 are referred to as data input and output signals and are cited by using the same reference marks as the data input and output lines DQ1 to DQ8. The data input and output signals DQ1 to DQ8 are regarded as being sent through the data input and output lines DQ1 to DQ8 using the same reference marks.

The input and output circuit 114 may output a ready/busy signal R/B to the controller 120. For example, when the input and output circuit 114 is ready to receive a command, an address, or data bits from the controller 120, the input and output circuit 114 may output the ready/busy signal R/B indicating a ready state. When the input and output circuit 114 cannot receive a command, an address, or data bits from the controller 120, the input and output circuit 114 may output the ready/busy signal R/B indicating a busy state.

After the verification read operation, the pass-fail check circuit 115 may receive a sensing result from the page buffer circuit 113. The pass-fail check circuit 115 may determine write or erase pass or fail based on the received sensing result. The pass or fail determination result may be provided to the control logic circuit 116.

The control logic circuit 116 may receive the data strobe signal DQS, an address latch enable signal ALE, a command latch enable signal CLE, a write enable signal /WE, a read enable signal /RE, and a chip enable signal /CE from the controller 120.

For example, the data strobe signal DQS sent to the control logic circuit 116 and the data strobe signal DQS that the input and output circuit 114 sends may be bidirectional signals sent through the same control line. In a data read (e.g., output) operation, the data strobe signal DQS may be controlled by the nonvolatile memory device 110a. In a data write (e.g., input) operation, the data strobe signal DQS may be controlled by the controller 120.

When the controller 120 sends data bits to the nonvolatile memory device 110a through the data input and output lines DQ1 to DQ8, the controller 120 may send the data strobe signal DQS. The control logic circuit 116 may allow the input and output circuit 114 to store (or latch) signals of the data input and output lines DQ1 to DQ8 at an appropriate timing in synchronization with the data strobe signal DQS.

When the nonvolatile memory device 110a sends data bits to the controller 120 through the data input and output lines DQ1 to DQ8, the input and output circuit 114 may send the data strobe signal DQS. The controller 120 may store (or latch) signals of the data input and output lines DQ1 to DQ8 at an appropriate timing in synchronization with the data strobe signal DQS.

The address latch enable signal ALE indicates that data bits input through the data input and output lines DQ1 to DQ8 are an address. If the address latch enable signal ALE is activated, the control logic circuit 116 may process the data bits input through the data input and output lines DQ1 to DQ8 as an address. For example, the control logic circuit 116 may control the input and output circuit 114 such that the row address RA is sent to the row decoder circuit 112.

The command latch enable signal CLE indicates that data bits input through the data input and output lines DQ1 to DQ8 are a command CMD. If the command latch enable signal CLE is activated, the control logic circuit 116 may process the data bits input through the data input and output lines DQ1 to DQ8 as the command CMD. For example, the control logic circuit 116 may fetch the command CMD stored in the input and output circuit 114 and may execute the fetched command.

When the command CMD or an address is received through the data input and output lines DQ1 to DQ8, the write enable signal /WE may indicate a timing to store (or latch) data bits of the data input and output lines DQ1 to DQ8. The read enable signal /RE may be used for the controller 120 to provide any clock to the nonvolatile memory device 110a in a read (or output) operation.

For example, in the read operation, the controller 120 may toggle the read enable signal /RE to a high level and a low level periodically. The control logic circuit 116 may send the read enable signal /RE to the input and output circuit 114. The input and output circuit 114 may delay the read enable signal /RE to generate the data strobe signal DQS. The input and output circuit 114 may send data bits through the data input and output lines DQ1 to DQ8 in synchronization with the data strobe signal DQS thus generated.

The chip enable signal /CE may select one of the nonvolatile memory devices 110a to 110z. The nonvolatile memory device selected by the chip enable signal /CE may occupy and use the first control lines CT1. Nonvolatile memory devices that are not selected by the chip enable signal /CE may ignore signals of the first control lines CT1.

The chip enable signal /CE may be used to select one of the nonvolatile memory devices 110a to 110z. Accordingly, the nonvolatile memory devices 110a to 110z receive the chip enable signal /CE through different control lines. That is, the chip enable signal /CE may be sent through the second control lines CT2.

The ready/busy signal R/B is used to indicate whether each of the nonvolatile memory devices 110a to 110z is in a ready state or in a busy state. Accordingly, the nonvolatile memory devices 110a to 110z send the ready/busy signal R/B through different control lines. That is, the ready/busy signal R/B may be sent through the second control lines CT2.

The data strobe signal DQS, the address latch enable signal ALE, the command latch enable signal CLE, the write enable signal /WE, and the read enable signal /RE may be conveyed in common in the nonvolatile memory devices 110a to 110z. That is, the data strobe signal DQS, the address latch enable signal ALE, the command latch enable signal CLE, the write enable signal /WE, and the read enable signal /RE may be conveyed through the first control lines CT1.

A nonvolatile memory device selected by the chip enable signal /CE among the nonvolatile memory devices 110a to 110z may use the data strobe signal DQS, the address latch enable signal ALE, the command latch enable signal CLE, the write enable signal /WE, and the read enable signal /RE of the first control lines CT1.

The remaining nonvolatile memory devices, which are not selected by the chip enable signal /CE, among the nonvolatile memory devices 110a to 110z may ignore the data strobe signal DQS, the address latch enable signal ALE, the command latch enable signal CLE, the write enable signal /WE, and the read enable signal /RE of the first control lines CT1.

The control logic circuit 116 may include an output trainer 117. The output trainer 117 may be a circuit or circuitry that performs training on data bits that the input and output circuit 114 outputs through the data input and output lines DQ1 to DQ8 in the read operation. The output trainer 117 may also be occasionally referred to in the present disclosure as output trainer circuit 117. The training will be more fully described later with reference to accompanying drawings.

Figure 3:
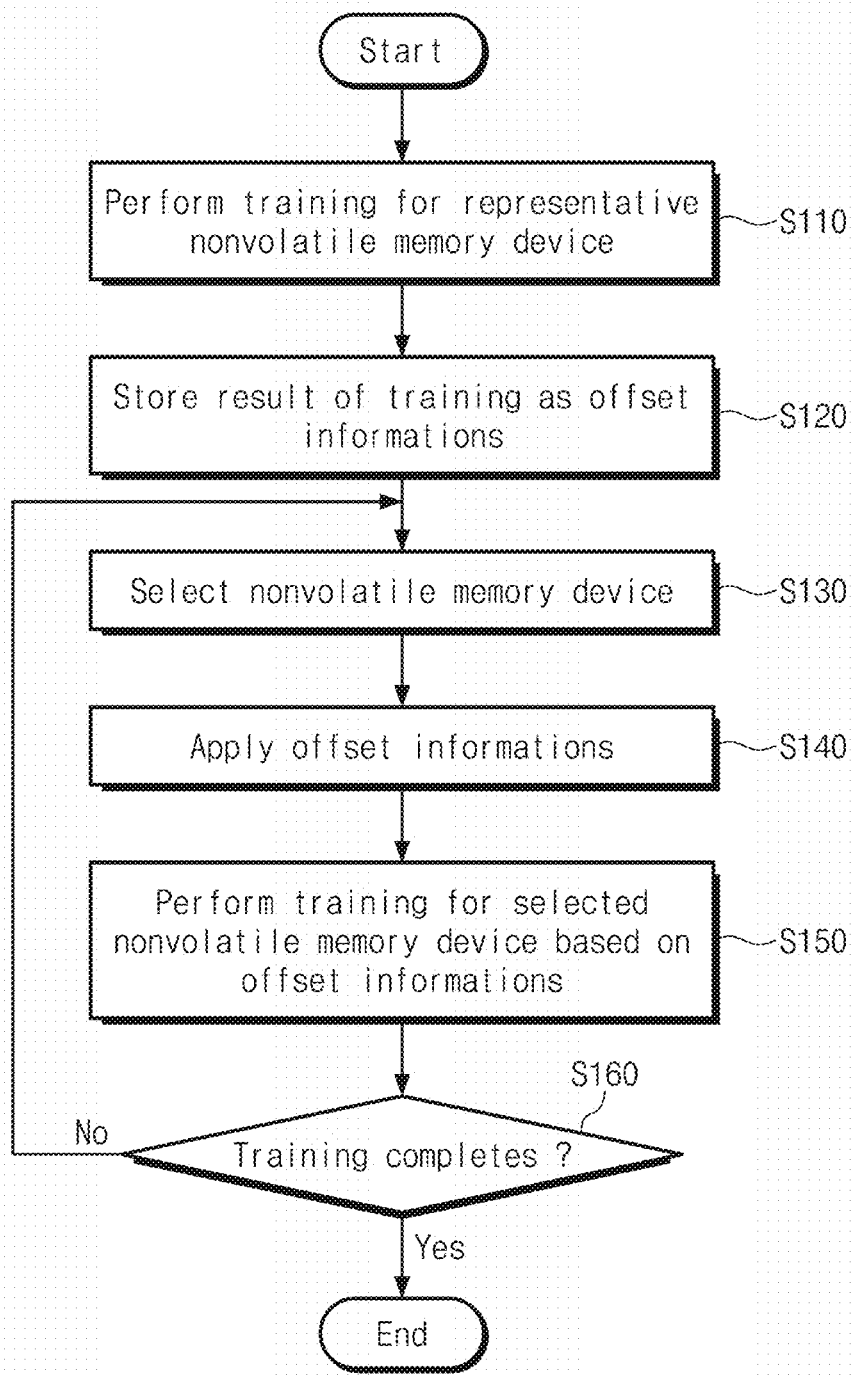
FIG. 3 is a flowchart illustrating an operating method of the storage device according to at least some example embodiments of the inventive concepts.

FIG. 3 is a flowchart illustrating an operating method of the storage device 100 according to at least some example embodiments of the inventive concepts. For example, an example of a method of training the data input and output lines DQ1 to DQ8 between the controller 120 and the nonvolatile memory devices 110a to 110z is illustrated in FIG. 3.

Referring to FIGS. 1 to 3, in operation S110, the storage device 100 may perform training on a representative nonvolatile memory device. For example, one of the nonvolatile memory devices 110a to 110z may be selected as the representative nonvolatile memory device. For a brief description, it is assumed that the nonvolatile memory device 110a is selected as the representative nonvolatile memory device. However, at least some example embodiments of the inventive concepts are not limited thereto.

For example, the storage device 100 may perform training (e.g., first training) on transmission timings of data bits sent through the data input and output lines DQ1 to DQ8 between the controller 120 and the representative nonvolatile memory device 110a.

In operation S120, the controller 120 may store the result of the first training of the representative nonvolatile memory device 110a as pieces of offset information (e.g., pieces of first offset information). The result of the first training may include transmission timings of data bits associated with the data input and output lines DQ1 to DQ8, for example, delays. The transmission timings of the representative nonvolatile memory device 110a may be set by the pieces of first offset information.

In operation S130, the controller 120 selects a nonvolatile memory device. For example, the controller 120 may select one nonvolatile memory device, which is not yet trained, from among the remaining nonvolatile memory devices 110b to 110z other than the representative nonvolatile memory device 110a.

In operation S140, the controller 120 may apply the pieces of first offset information obtained in the first training with the representative nonvolatile memory device 110a. For example, the controller 120 may apply delays included in the pieces of first offset information to the controller 120 or a selected nonvolatile memory device.

In operation S150, the controller 120 may perform training (e.g., second training) on the selected nonvolatile memory device based on the pieces of first offset information. For example, the controller 120 may detect additional delays through training with the selected nonvolatile memory device in addition to the delays included in the pieces of first offset information. A result of summing the delays and the additional delays may be second offset information. The transmission timings of the selected nonvolatile memory device may be set by the pieces of second offset information.

In operation S160, the controller 120 may determine whether training is completed. For example, if a nonvolatile memory device that is not yet trained is present in the remaining nonvolatile memory devices 110b to 110z, the controller 120 may determine that training is not completed. In operation S130, another nonvolatile memory device may be selected, and operation S140 to operation S160 may be again performed.

If a nonvolatile memory device that is not yet trained is absent from the remaining nonvolatile memory devices 110b to 110z, the controller 120 may determine that training is completed. If training is completed, the storage device 100 may terminate the training on the nonvolatile memory devices 110a to 110z. Afterwards, a next process of a power-on or wake-up procedure may be performed, or a power-on or wake-up procedure may be terminated.

According to at least one example embodiment of the inventive concepts, in operation S140, a description is given as the controller 120 applies the pieces of first offset information obtained from the representative nonvolatile memory device 110a. However, in operation S140, the controller 120 may be modified or applied to apply the pieces of second offset information derived from the pieces of first offset information.

Figure 4:
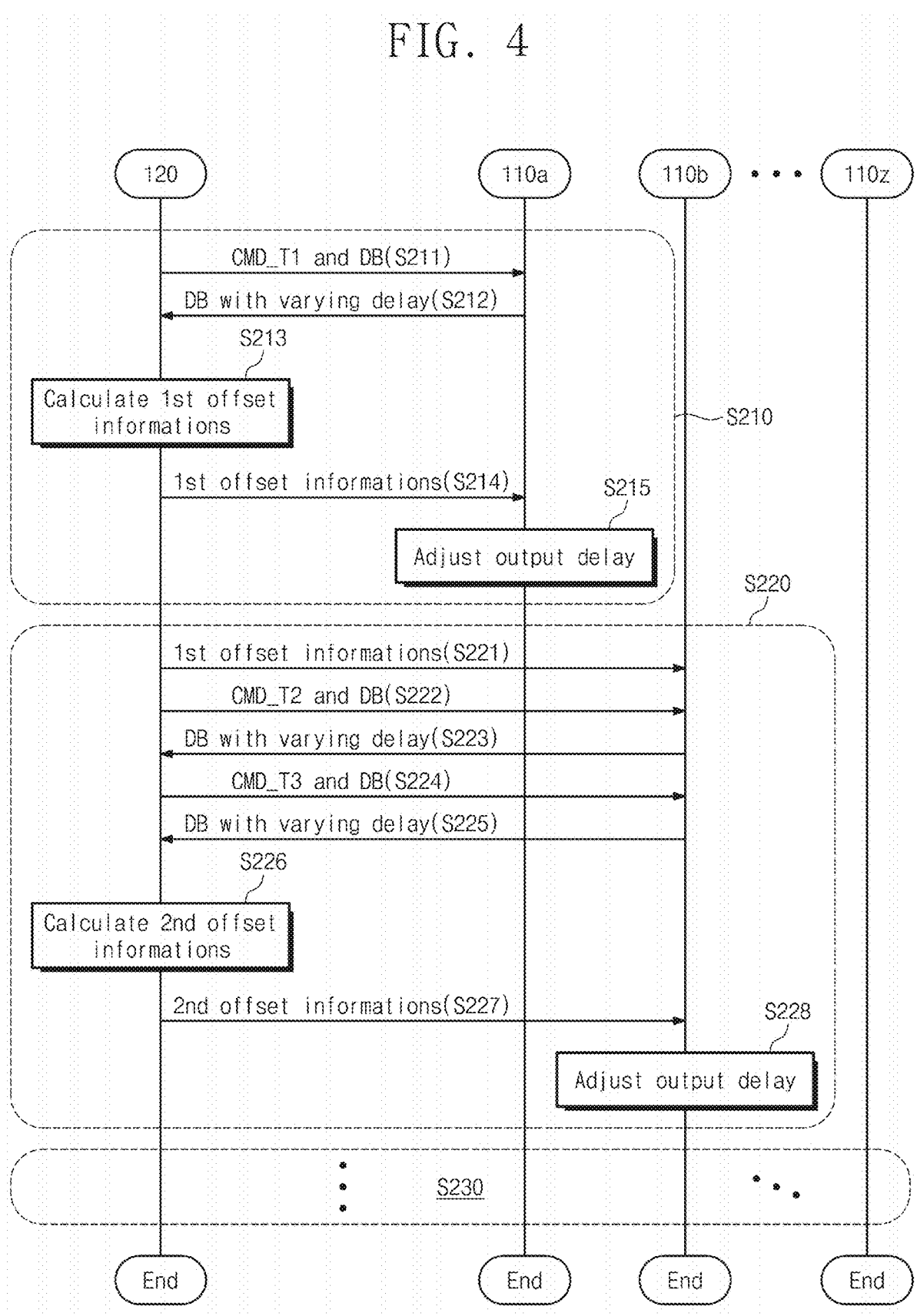
FIG. 4 is a flowchart illustrating an example in which first-step training according to at least some example embodiments of the inventive concepts is performed.

FIG. 4 is a flowchart illustrating an example in which first-step training according to at least some example embodiments of the inventive concepts is performed. According to at least one example embodiment of the inventive concepts, the first-step training may include output training or read training for aligning timings to send data bits that the nonvolatile memory devices 110a to 110z send to the controller 120 through the data input and output lines DQ1 to DQ8.

Referring to FIGS. 1, 2, and 4, in operation S210, the first training is performed on the representative nonvolatile memory device 110a. In detail, in operation S211, the controller 120 may send a first training command CMD_T1 and data bits DB to the representative nonvolatile memory device 110a. For example, the first training command CMD_T1 and the data bits DB may be sent through the data input and output lines DQ1 to DQ8 in the form of a command. The data bits DB may include a specific data pattern stored in the memory 123.

In operation S212, the representative nonvolatile memory device 110a may send the data bits DB to the controller 120 through the data input and output lines DQ1 to DQ8 in response to the first training command CMD_T1 and the data bits DB. The data bits DB may be sent in the form of data.

For example, the representative nonvolatile memory device 110a may send the data bits DB while adjusting transmission timings, for example, delays of the data bits DB. For example, the representative nonvolatile memory device 110a may repeatedly send the data bits DB while adjusting delays, in response to receiving the first training command CMD_T1 and the data bits DB.

In other words, an operation in which the controller 120 sends the first training command CMD_T1 and the data bits DB to the representative nonvolatile memory device 110a may be performed once. Afterwards, an operation in which the representative nonvolatile memory device 110a sends the data bits DB to the controller 120 may be performed as much as the given number of times.

As another example, the controller 120 may repeatedly send the first training command CMD_T1 and the data bits DB to the representative nonvolatile memory device 110a. The first training commands CMD_T1 that are repeatedly sent may request different delays (or transmission timings). In response to the first training commands CMD_T1 repeatedly received, the representative nonvolatile memory device 110a may send the data bits DB while adjusting delays.

In other words, an operation in which the controller 120 sends the first training command CMD_T1 and the data bits DB to the representative nonvolatile memory device 110a and an operation in which the representative nonvolatile memory device 110a sends the data bits DB to the controller 120 may form one pair. The pair thus formed may be repeated as much as the given number of times.

In operation S213, the controller 120 may calculate the pieces of first offset information based on the data bits DB that are received from the representative nonvolatile memory device 110a while varying delays. The pieces of first offset information may include delays of the data input and output lines DQ1 to DQ8, which are needed for the representative nonvolatile memory device 110a to output aligned data bits DB through the data input and output lines DQ1 to DQ8. The pieces of first offset information may be stored in the controller 120, for example, the memory 123.

In operation S214, the controller 120 may send the pieces of first offset information to the representative nonvolatile memory device 110a. For example, the pieces of first offset information may be sent in the form of a command. In operation S215, the representative nonvolatile memory device 110a may adjust output delays depending on the pieces of first offset information. For example, the representative nonvolatile memory device 110a may align timings to output the data bits DB through the data input and output lines DQ1 to DQ8.

After the first training associated with the representative nonvolatile memory device 110a is completed, the second training may be performed on the remaining nonvolatile memory devices 110b to 110z. For example, in operation S220, the second training may be performed on the nonvolatile memory device 110b. In detail, in operation S221, the controller 120 may send the pieces of first offset information to the nonvolatile memory device 110b.

In operation S222, the controller 120 may send a second training command CMD_T2 and data bits DB to the nonvolatile memory device 110b. For example, the second training command CMD_T2 and the data bits DB may be sent through the data input and output lines DQ1 to DQ8 in the form of a command.

In operation S223, the nonvolatile memory device 110b may send the data bits DB to the controller 120 through the data input and output lines DQ1 to DQ8 in response to the second training command CMD_T2 and the data bits DB. The data bits DB may be sent in the form of data.

For example, in response to the second training command CMD_T2, the nonvolatile memory device 110b may set initial delays depending on the pieces of first offset information. The nonvolatile memory device 110b may repeatedly send the data bits DB while adjusting delays from the initial delays. Operation S222 and operation S223 may be performed through repeated transmission of the data bits DB according to the second training command CMD_T2 as described with reference to operation S211 and operation S212.

Alternatively, operation S222 and operation S223 may be performed by repeating a pair of transmission of the second training command and transmission of the data bits DB. If operation S222 and operation S223 are performed, the controller 120 may detect a first boundary (e.g., a start boundary) of each of the data bits DB. If the first boundaries of the data bits DB are detected, operation S224 and operation S225 may be performed.

In operation S224, the controller 120 may send a third training command CMD_T3 and the data bits DB to the nonvolatile memory device 110b. For example, the third training command CMD_T3 and the data bits DB may be sent through the data input and output lines DQ1 to DQ8 in the form of a command.

In operation S225, the nonvolatile memory device 110b may send the data bits DB to the controller 120 through the data input and output lines DQ1 to DQ8 in response to the third training command CMD_T3 and the data bits DB. The data bits DB may be sent in the form of data.

For example, in response to the third training command CMD_T3, the nonvolatile memory device 110b may set intermediate delays depending on the pieces of first offset information. The nonvolatile memory device 110b may repeatedly send the data bits DB while adjusting delays from the initial delays. Operation S224 and operation S225 may be performed through repeated transmission of the data bits DB according to the second training command CMD_T2 as described with reference to operation S211 and operation S212.

Alternatively, operation S224 and operation S225 may be performed by repeating a pair of transmission of the second training command and transmission of the data bits DB. If operation S224 and operation S225 are performed, the controller 120 may detect a second boundary (e.g., an end boundary) of each of the data bits DB. If the second boundaries of the data bits DB are detected, operation S226 may be performed.

According to at least one example embodiment of the inventive concepts, in operation S221, the initial delays and the intermediate delays of the pieces of first offset information may be sent to the nonvolatile memory device 110b. As another example, in operation S221, the initial delays of the pieces of first offset information may be sent to the nonvolatile memory device 110b. Between operation S223 and operation S224, the controller 120 may send the intermediate delays of the pieces of first offset information to the nonvolatile memory device 110b.

As another example, the initial delays of the pieces of first offset information may be included in the second training command CMD_T2 or in the data bits DB sent along with the second training command CMD_T2. The intermediate delays of the pieces of second offset information may be included in the third training command CMD_T3 or in the data bits DB sent along with the third training command CMD_T3.

In operation S226, the controller 120 may calculate the pieces of second offset information based on the first boundaries detected in operation S222 and operation S223 and the second boundaries detected in operation S224 and operation S225. The pieces of second offset information may include delays of the data input and output lines DQ1 to DQ8, which are needed for the nonvolatile memory device 110b to output aligned data bits DB through the data input and output lines DQ1 to DQ8. The pieces of second offset information may be stored in the controller 120, for example, the memory 123.

In operation S227, the controller 120 may send the pieces of second offset information to the nonvolatile memory device 110b. For example, the pieces of second offset information may be sent in the form of a command. In operation S228, the nonvolatile memory device 110b may adjust output delays depending on the pieces of second offset information. For example, the nonvolatile memory device 110b may align timings to output the data bits DB through the data input and output lines DQ1 to DQ8.

Afterwards, in operation S230, the second training associated with the remaining nonvolatile memory devices may continue. The second training associated with the remaining nonvolatile memory devices may be performed the same as operation S220. Accordingly, a description of the second training associated with the remaining nonvolatile memory devices will not be repeated here.

Figure 5:
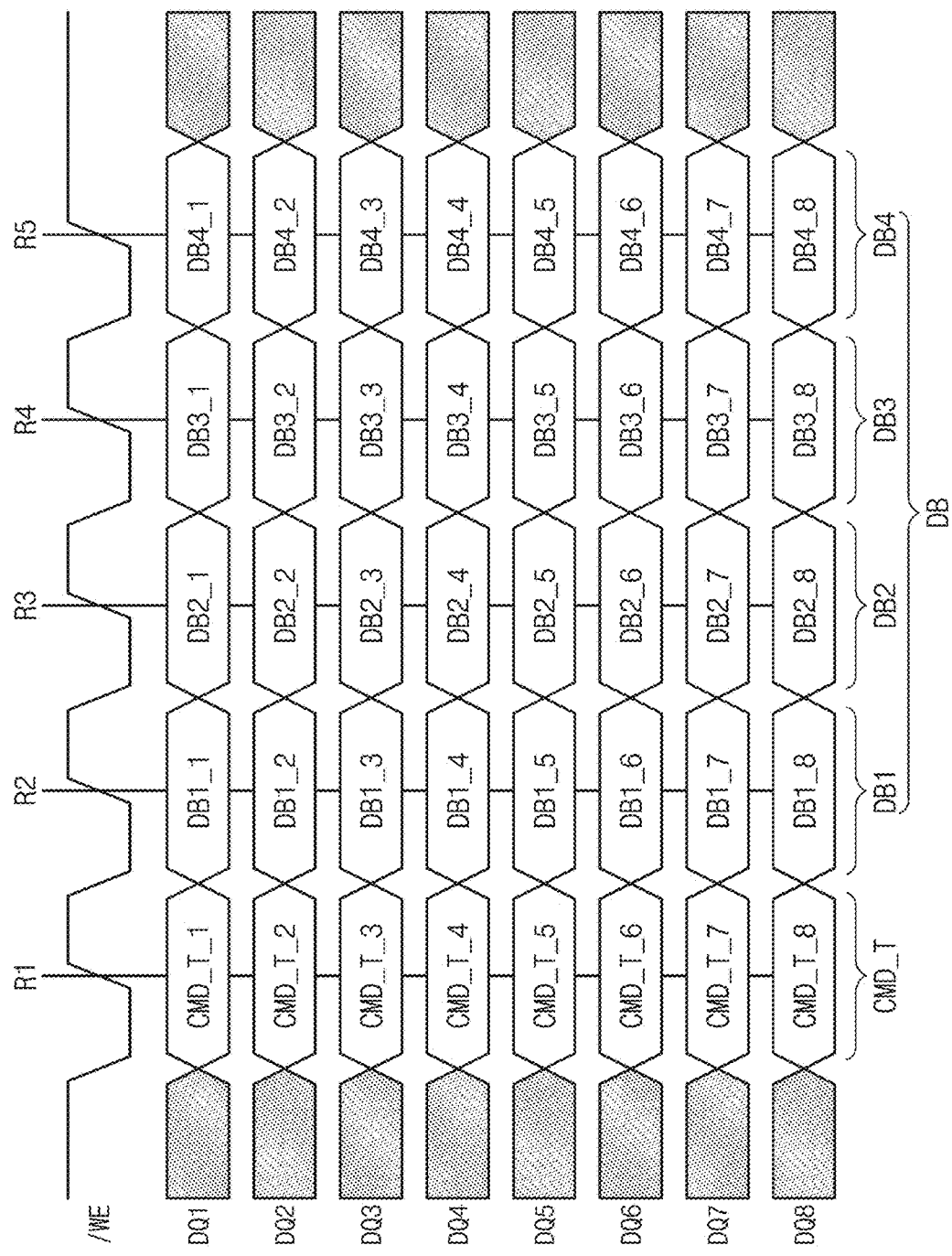
FIG. 5 illustrates an example in which a controller sends a training command and data bits.

FIG. 5 illustrates an example in which the controller 120 transmits the training command CMD_T and the data bits DB. Referring to FIGS. 1, 2, and 5, the training command CMD_T and the data bits DB may be sent through the data input and output lines DQ1 to DQ8 in synchronization with the write enable signal /WE. The command latch enable signal CLE may maintain a high level while the training command CMD_T and the data bits DB are transmitted.

The training command CMD_T may be sent in synchronization with a first rising edge R1 of the write enable signal /WE. The training command CMD_T may include command bits CMD_T_1 to CMD_T_8 respectively corresponding to the data input and output lines DQ1 to DQ8. The training command CMD_T may be one of the first to third training commands CMD_T1 to CMD_T3. The training command CMD_T may be sent once in synchronization with a rising edge of the write enable signal /WE or may be repeatedly sent as much as the given number of times in synchronization with rising edges of the write enable signal /WE.

The data bits DB may include first to fourth data bits DB1 to DB4 that are respectively sent in synchronization with second to fifth rising edges R2 to R5 of the write enable signal /WE. The first data bits DB1 may include first bits DB1_1 to DB1_8 respectively sent through the data input and output lines DQ1 to DQ8. Likewise, the second data bits DB2, the third data bits DB3, and the fourth data bits DB4 may include second bits DB2_1 to DB2_8, third bits DB3_1 to DB3_8, and fourth bits DB4_1 to DB4_8.

The data bits DB are described in FIG. 5 as being sent in synchronization with four rising edges R2 to R5 of the write enable signal /WE. However, timings when the data bits DB are sent are not limited to four rising edges of the write enable signal /WE. The data bits DB may be sent less or more than four times.

Figure 6:
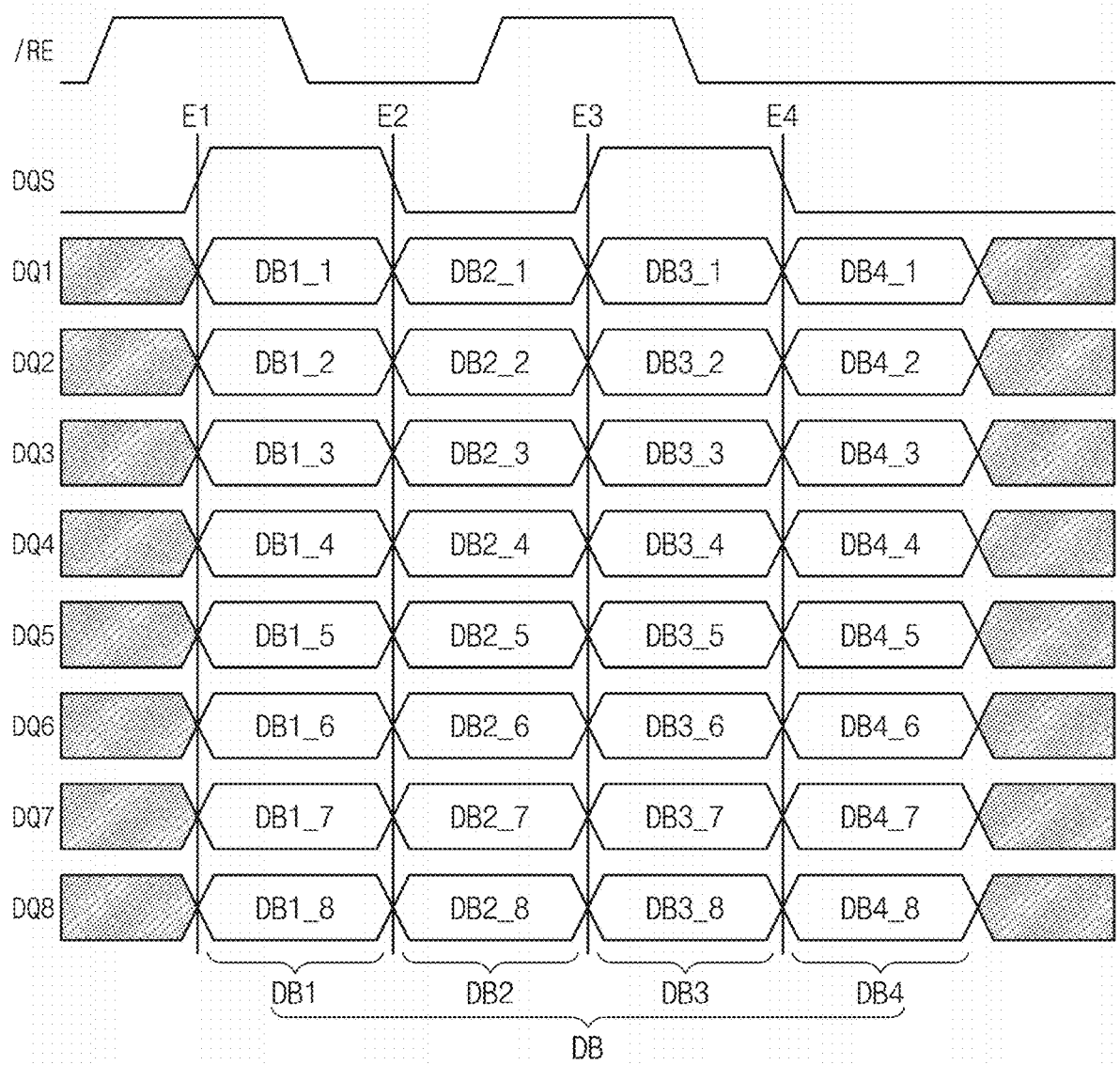
FIG. 6 illustrates an example in which the nonvolatile memory device outputs data bits in response to a training command and data bits of FIG. 5.

FIG. 6 illustrates an example in which a nonvolatile memory device outputs data bits in response to the training command CMD_T and the data bits DB of FIG. 5. A nonvolatile memory device may be any one of the nonvolatile memory devices 110a to 110z. Referring to FIGS. 1, 2, and 6, the controller 120 may toggle the read enable signal /RE to a high level and a low level periodically. In response to the read enable signal /RE, the input and output circuit 114 may toggle the data strobe signal DQS to a high level and a low level periodically.

The input and output circuit 114 may output the data bits DB in synchronization with the data strobe signal DQS. The input and output circuit 114 may output the data bits DB in synchronization with each of rising edges and falling edges of the data strobe signal DQS. The data bits DB may be aligned with the data strobe signal DQS, and thus, the data bits DB and the data strobe signal DQS may be mutually aligned.

Figure 7:
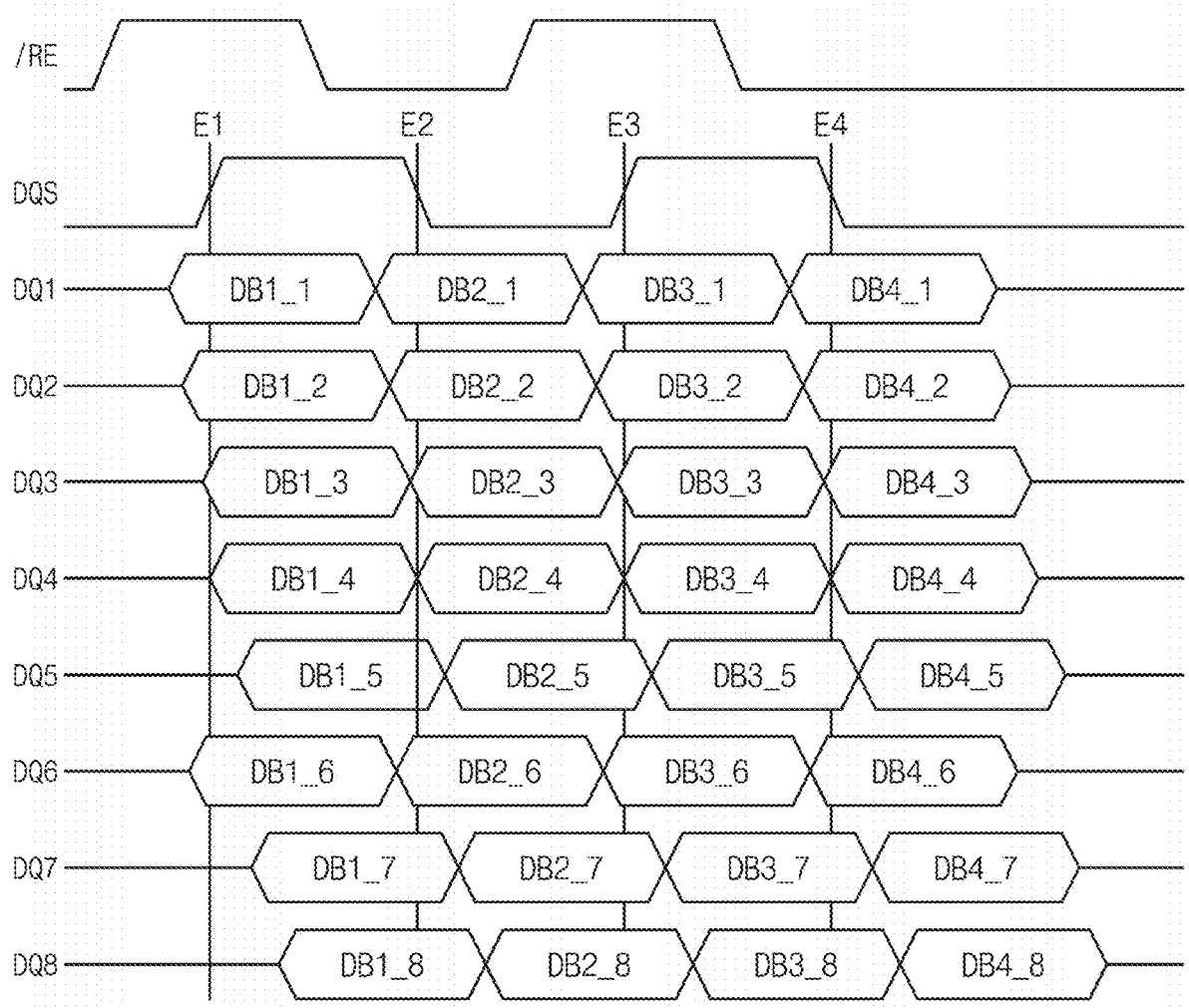
FIG. 7 illustrates an example in which data bits of FIG. 6 are received by the controller.

FIG. 7 illustrates an example in which the data bits DB of FIG. 6 are received by the controller 120. According to at least one example embodiment of the inventive concepts, timings of the data bits DB received by the controller 120 may be different from timings (refer to FIG. 6) of the data bits DB that a nonvolatile memory device transmits, due to various environment factors such as parasitic resistance, parasitic capacitance, parasitic inductance, temperature, or humidity.

Referring to FIGS. 1, 2, and 7, the input and output circuit 114 may generate the data strobe signal DQS from the read enable signal /RE. The input and output circuit 114 may output the data bits DB in synchronization with the data strobe signal DQS.

Timings of bits DB1_1 to DB4_1 sent through a first data input and output line DQ1 may be advanced with respect to timings of edges of the data strobe signal DQS. Timings of bits DB1_2 to DB4_2 sent through a second data input and output line DQ2 may be advanced with respect to timings of the edges of the data strobe signal DQS. Timings of bits DB1_3 to DB4_3 sent through a third data input and output line DQ3 may be advanced with respect to timings of the edges of the data strobe signal DQS.

Timings of bits DB1_4 to DB4_4 sent through a fourth data input and output line DQ4 may be matched with respect to timings of the edges of the data strobe signal DQS. Timings of bits DB1_5 to DB4_5 sent through a fifth data input and output line DQ5 may be delayed with respect to timings of the edges of the data strobe signal DQS. Timings of bits DB1_6 to DB4_6 sent through a sixth data input and output line DQ6 may be advanced with respect to timings of the edges of the data strobe signal DQS.

Timings of bits DB1_7 to DB4_7 sent through a seventh data input and output line DQ7 may be delayed with respect to timings of the edges of the data strobe signal DQS. Timings of bits DB1_8 to DB4_8 sent through an eighth data input and output line DQ8 may be delayed with respect to timings of the edges of the data strobe signal DQS. Timings of data bits sent through the data input and output lines DQ1 to DQ8 may not be matched with each other.

To compensate for differences between timings illustrated in FIGS. 6 and 7, the nonvolatile memory devices 110*a* to 110*z* may adjust timings to send the data bits DB. For example, the nonvolatile memory devices 110*a* to 110*z* may perform training with the controller 120 to detect appropriate transmission timings (or delays) and may adjust transmission timings (or delays) depending on the detection result.

Figure 8:
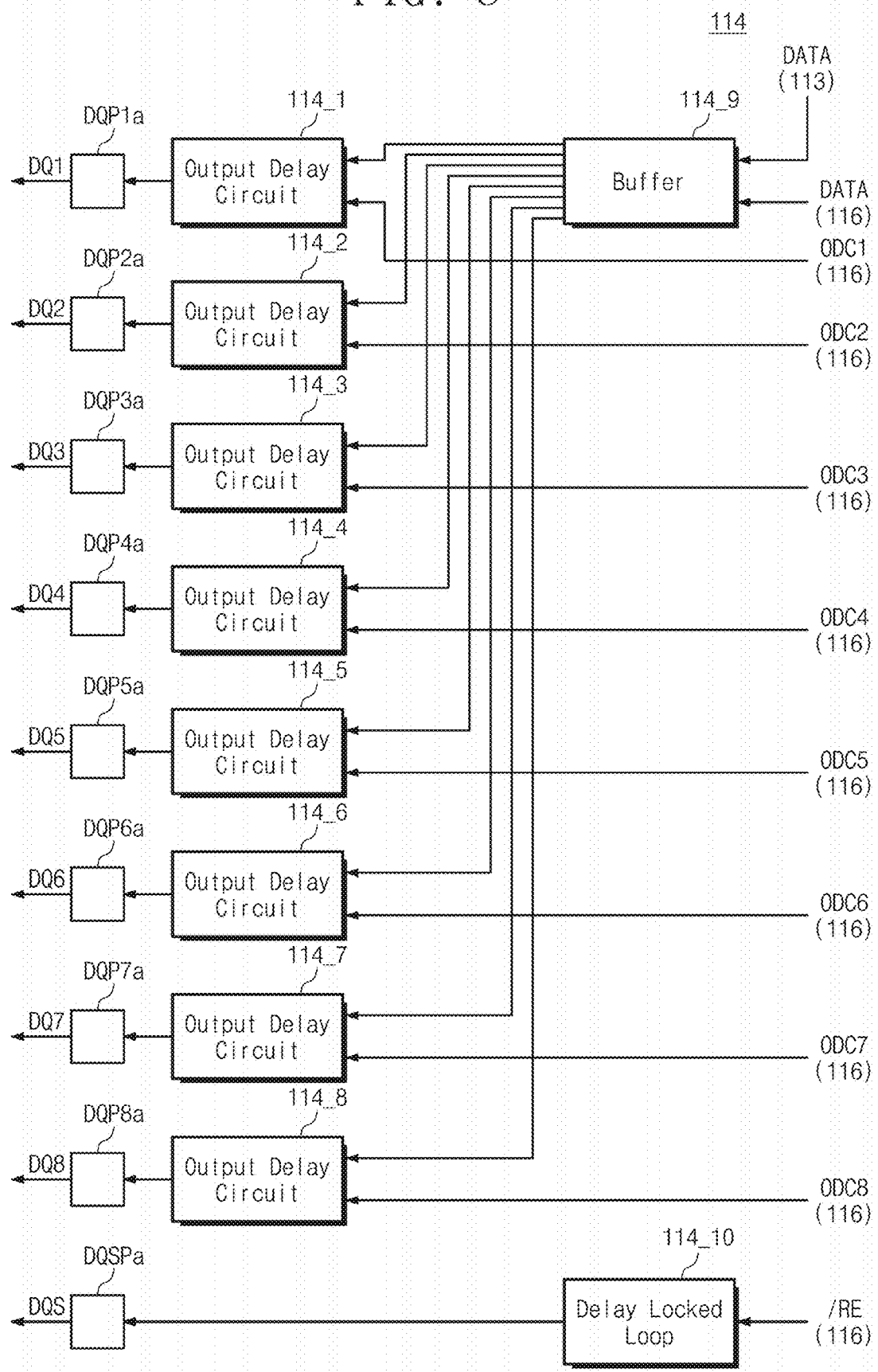
FIG. 8 illustrates an example of an input and output circuit of the nonvolatile memory device.

FIG. 8 illustrates an example of the input and output circuit 114 of the nonvolatile memory device 110*a*. Referring to FIGS. 2 and 8, the input and output circuit 114 includes data input and output pads DQP1*a* to DQP8*a*, a data strobe pad DQSPa, output delay circuits 114_1 to 114_8, a buffer 114_9, and a delay locked loop 114_10.

The data input and output pads DQP1*a* to DQP8*a* may send the data input and output signals DQ1 to DQ8. One or more example embodiments of the inventive concepts will be explained with reference to an example in which it is assumed that the data input and output pads DQP1*a* to DQP8*a* output the data input and output signals DQ1 to DQ8 to the controller 120.

However, it may be understood that, according to at least some example embodiments of the inventive concepts, the data input and output pads DQP1*a* to DQP8*a* receive the data input and output signals DQ1 to DQ8 from the controller 120 and components for processing the received data input and output signals DQ1 to DQ8 are provided in the input and output circuit 114.

The data strobe pad DQSPa may send the data strobe signal DQS. One or more example embodiments of the inventive concepts will be explained with reference to an example in which it is assumed that the data strobe pad DQSPa outputs the data strobe signal DQS to the controller 120. However, it may be understood that, according to at least some example embodiments of the inventive concepts, the data strobe pads DQSPa receives the data strobe signal DQS from the controller 120 and components for processing the received data strobe signal DQS are provided in the input and output circuit 114.

The output delay circuits 114_1 to 114_8 are respectively connected to the data input and output pads DQP1*a* to DQP8*a*. The output delay circuits 114_1 to 114_8 may send data bits from the buffer 114_9 to the data input and output pads DQP1*a* to DQP8*a*, respectively. The output delay circuits 114_1 to 114_8 may receive output delay control signals ODC1 to ODC8 sent from the control logic circuit 116, respectively.

The output delay circuits 114_1 to 114_8 may individually control timings (or delays) to output data bits in response to the output delay control signals ODC1 to ODC8. For example, the first output delay circuit 114_1 may adjust a timing (delay) to send a data bit from the buffer 114_9 in response to the first output delay control signal ODC1.

The buffer 114_9 may send data bits to the output delay circuits 114_1 to 114_8. For example, in the training operation, the data bits DB sent from the control logic circuit 116 may be provided to the output delay circuits 114_1 to 114_8 after being stored in the buffer 114_9. In the normal operation in which training is not made, data "DATA" sent from the page buffer circuit 113 may be provided to the output delay circuits 114_1 to 114_8 after being stored in the buffer 114_9.

In a read operation or a first-step training operation, the delay locked loop 114_10 may receive the read enable signal /RE from the control logic circuit 116. The delay locked loop 114_10 may delay the read enable signal /RE to generate the data strobe signal DQS. The data strobe signal DQS may be sent to the controller 120 through the data strobe pad DQSPa.

Figure 9:
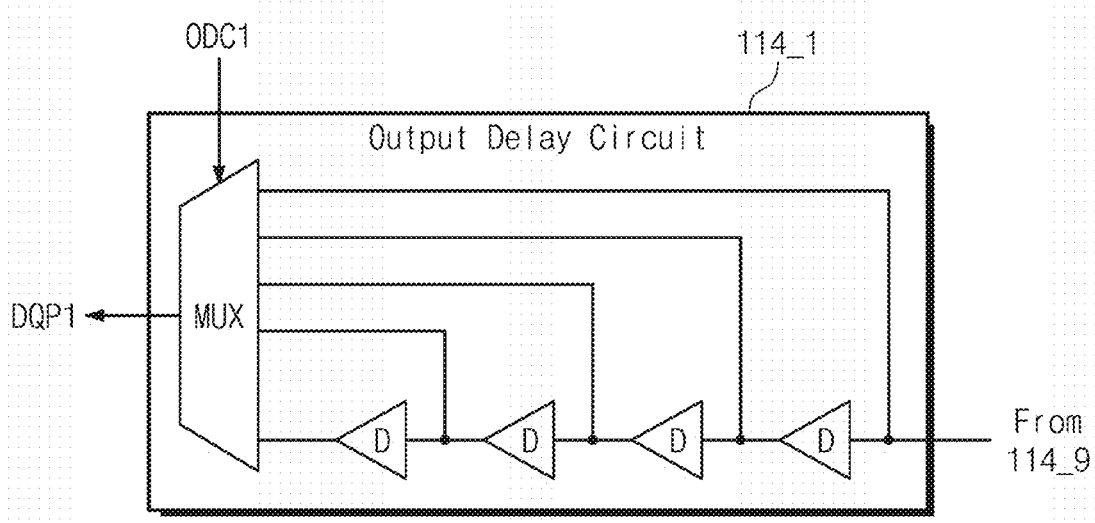
FIG. 9 illustrates an example of an output delay circuit of FIG. 8.

FIG. 9 illustrates an example of the output delay circuit 114_1 of FIG. 8. Referring to FIGS. 1, 2, 8, and 9, the output delay circuit 114_1 includes delay elements "D" and a multiplexer MUX. The delay elements "D" may be sequentially connected to each other. An output of the buffer 114_9 may be connected to the delay elements "D".

The multiplexer MUX may receive a data bit output from the buffer 114_9 and data bits (e.g., data bits having different delays) delayed by the delay elements "D". The multiplexer MUX may send one of the data bit output from the buffer 114_9 and the data bits delayed by the delay elements "D" to the data input and output pad DQP1*a* in response to the output delay control signal ODC1.

That is, the control logic circuit 116 or the output trainer 117 may adjust a timing (e.g., a delay) when the output delay circuit 114_1 outputs a data bit by adjusting a kind of a data bit selected by the output delay control signal ODC1. Only the output delay circuit 114_1 is illustrated in FIG. 9, and the remaining output delay circuits 114_2 to 114_8 may also have the same structure as illustrated in FIG. 9.

That is, the control logic circuit 116 or the output trainer 117 may select respective values of the respective output delay control signals ODC1 to ODC8 such that respective multiplexers of the respective output delay circuits 114_1-114_8 select respective data bit output from the buffer 114_9.

That is, the control logic circuit 116 or the output trainer 117 may adjust timings (e.g., delays) when the output delay circuits 114_1 to 114_8 output data bits by individually adjusting the output delay control signals ODC1 to ODC8.

Figure 10:
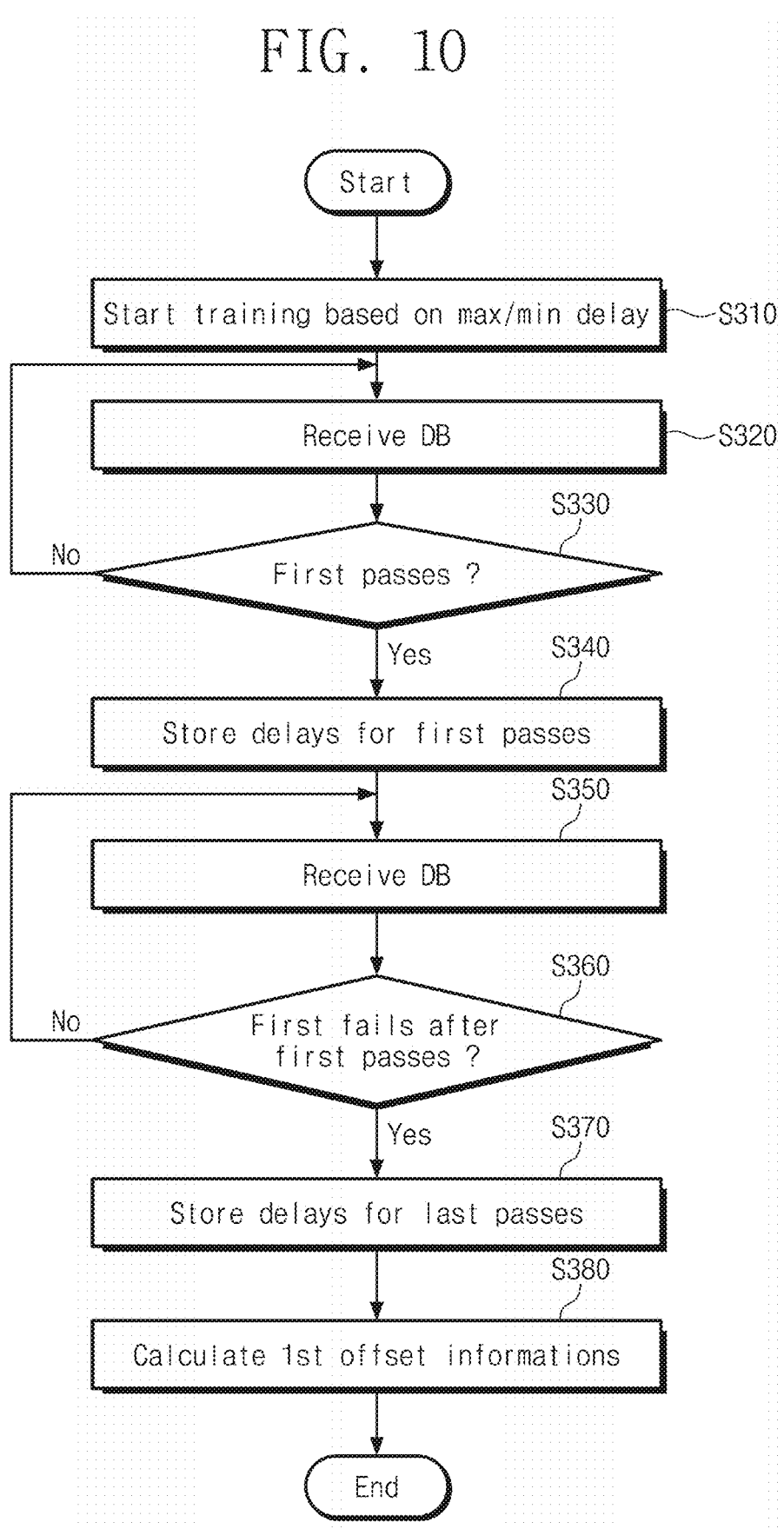
FIG. 10 is a flowchart illustrating an example in which the controller and the representative nonvolatile memory device perform first-step training.

FIG. 10 is a flowchart illustrating an example in which the controller 120 and the representative nonvolatile memory device 110a perform first-step training. Referring to FIGS. 1, 2, 8, and 10, in operation S310, the controller 120 and the nonvolatile memory device 110a may start training based on maximum/minimum delays. For example, delays of the output delay circuits 114_1 to 114_8 may be set to the maximum delays or the minimum delays.

In operation S320, the controller 120 may receive the data bits DB from the representative nonvolatile memory device 110a. In operation S330, the controller 120 may determine whether first passes are detected. For example, when a valid value (or information) is received through a specific data input and output line in the controller 120, the controller 120 may determine that the specific data input and output line is passed.

For example, the valid value may be a value of a relevant bit of the data bits DB that the controller 120 sends to the representative nonvolatile memory device 110a. That is, after the controller 120 sends a specific data bit to the representative nonvolatile memory device 110a through the specific data input and output line (e.g., in the form of a command), if a specific bit is received through the specific data input and output line in the controller 120, the specific data input and output line may be determined as being passed.

If the first passes are not determined, in operation S320, the controller 120 may receive next data bits DB. The next data bits DB may have increased or decreased delays. Operation S320 and operation S330 may be repeated until the first passes are detected at the data input and output lines DQ1 to DQ8.

If the first passes are determined, first boundaries (e.g., start or end boundaries) of the data bits DB are detected. In operation S340, the controller 120 may store delays associated with the first passes. That is, the controller 120 may store delays corresponding to the first boundaries of the data bits DB.

In operation S350, the controller 120 may receive the data bits DB. An example is illustrated in FIG. 10 as operation S330 and operation S340 are performed between operation S320 and operation S350. However, an operation in which the controller 120 receives the data bits DB may be continuously performed. While the data bits DB are continuously received, the controller 120 may determine the first passes and may store delays.

In operation S360, the controller 120 may determine whether first fails are detected after the first passes (i.e., first fails since the corresponding first passes). Unlike the pass, if a valid value is not received through the specific data input and output line in the controller 120, that is, if an invalid value is received, it is determined that the specific data input and output line fails.

If the first fails are not detected after the first passes, in operation S350, the controller 120 may receive next data bits DB. The next data bits DB may have increased or decreased delays. That is, operation S350 and operation S360 may be repeated until the first fails are detected at the data input and output lines DQ1 to DQ8 after the first passes.

If the first fails are determined after the first passes, second boundaries (e.g., end or start boundaries) of the data bits DB are detected. In operation S370, the controller 120 may store delays associated with the first fails after the first passes or delays associated with the last passes before fails. That is, the controller 120 may store delays corresponding to the second boundaries of the data bits DB.

In operation S380, the controller 120 may calculate the pieces of first offset information depending on the delays of the first boundaries and the delays of the second boundaries. Afterwards, as described with reference to FIG. 4, the controller 120 may send the pieces of first offset information to the representative nonvolatile memory device 110a. The representative nonvolatile memory device 110a may respectively adjust the delays of the output delay circuits 114_1 to 114_8 depending on the pieces of first offset information.

Figure 11:
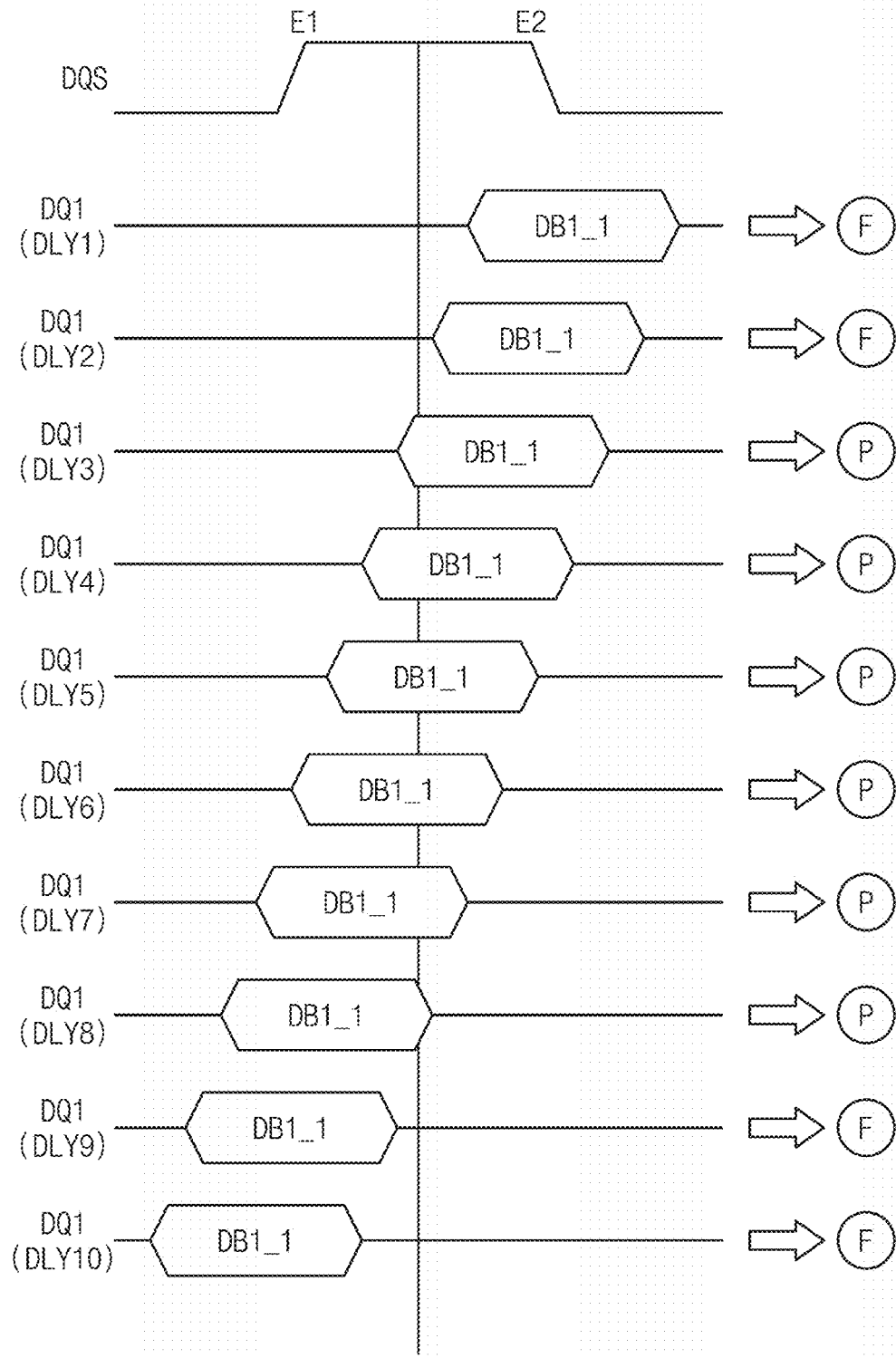
FIG. 11 illustrates an example in which pieces of first offset information are calculated according to a method of FIG. 10.

FIG. 11 illustrates an example in which pieces of first offset information are calculated according to a method of FIG. 10. According to at least one example embodiment of the inventive concepts, an example in which a first bit DB1_1 is received with different delays through a first data input and output line DQ1 from the controller 120 is illustrated in FIG. 11. In FIG. 11, it is assumed that a delay decreases from a first delay DLY1 to a tenth delay DLY10 toward the bottom.

Referring to FIGS. 1, 2, 8, 9, and 11, when received in the controller 120, the bit DB1_1 received with the first delay DLY1 may not be synchronized with the data strobe signal DQS, for example, the center of the data strobe signal DQS. Accordingly, an invalid value is received by the controller 120 through the first data input and output line DQ1, and the fail "F" is determined.

When received in the controller 120, the bit DB1_1 received with the second delay DLY2 may not be synchronized with the data strobe signal DQS. Accordingly, the fail "F" is determined. When received in the controller 120, the bit DB1_1 received with the third delay DLY3 may be synchronized with the data strobe signal DQS. Accordingly, the pass "P" is determined.

When received in the controller 120, the bit DB1_1 received with the fourth to eighth delays DLY4 to DLY8 may be synchronized with the data strobe signal DQS. Accordingly, the passes "P" are determined. When received in the controller 120, the bit DB1_1 received with the ninth and the tenth delays DLY 9 and DLY10 may not be synchronized with the data strobe signal DQS. Accordingly, the fail "F" is determined.

As illustrated in FIG. 11, when a first pass is determined according to the third delay DLY3, a first boundary (e.g., a start boundary) of the bit DB1_1 is detected. The controller 120 may store the third delay DLY3 in relation to the first boundary. As another example, the controller 120 may not directly store the third delay DLY3, but it may store which bit corresponds to a first pass.

When a first fail (i.e., the first fail since a corresponding first pass) is determined according to the ninth delay DLY9 after the first pass, a second boundary (e.g., an end boundary) of the bit DB1_1 is detected. The controller 120 may store the ninth delay DLY9 or the eighth delay DLY8 in relation to the second boundary of the bit DB1_1. As another example, the controller 120 may not directly store the ninth delay DLY9 or the eighth delay DLY8, but it may store which bit corresponds to a first fail (or the last pass) after the first pass.

The controller 120 may calculate an average (or an intermediate value) of a delay associated with the first boundary and a delay associated with the second boundary and may store the calculated delay as the first offset information. The controller 120 may store the delay associated with the first boundary and the delay associated with the second boundary as the first offset information. Offset information may refer to information indicating one or more delays that cause data output from a memory device (e.g., the first memory device 130a) via a data input and output line (e.g., data input and output line DQ1) to be received at the controller 120 as valid data.

For example, the term "offset information," as used in the present disclosure (e.g., first offset information, second offset information, etc.), may refer to data indicating a range of delays (e.g., the third delay DLY3—the eighth delay DLY8) or a delay (e.g., the third delay DLY3 or an average of the third and eight delays DLY3 and DLY8) that, when applied to data being output by a transmitting device (e.g., the first memory device 110a or the controller 120) via an input and output line (e.g., data input and output line DQ1), result in the output data being received as valid data by a receiving device (e.g., the controller 120 or the first memory device 110a). As is illustrated in FIG. 11 and discussed above, valid data may be, for example, data that is aligned with corresponding timing information (e.g., a data strobe signal DQS).

The training operation described with reference to FIG. 11 may be equally performed with respect to the remaining data input and output lines DQ2 to DQ8. For example, the training operation may be performed on the data input and output lines DQ1 to DQ8 independently of each other, in parallel, or individually (e.g., simultaneously). Through the training operation, the controller 120 may detect timings of the data bits DB and may detect the pieces of first offset information for aligning data bits.

An example in which training is performed while sequentially advancing the bit DB1_1 is illustrated in FIG. 11. However, at least some example embodiments of the inventive concepts may be applied such that training is performed while sequentially delaying the bit DB1_1. According to at least one example embodiment of the inventive concepts, as the second boundaries are detected, the controller 120 may ignore the remaining delays that are not yet applied and may terminate the training with the representative nonvolatile memory device 110a.

Figure 12:
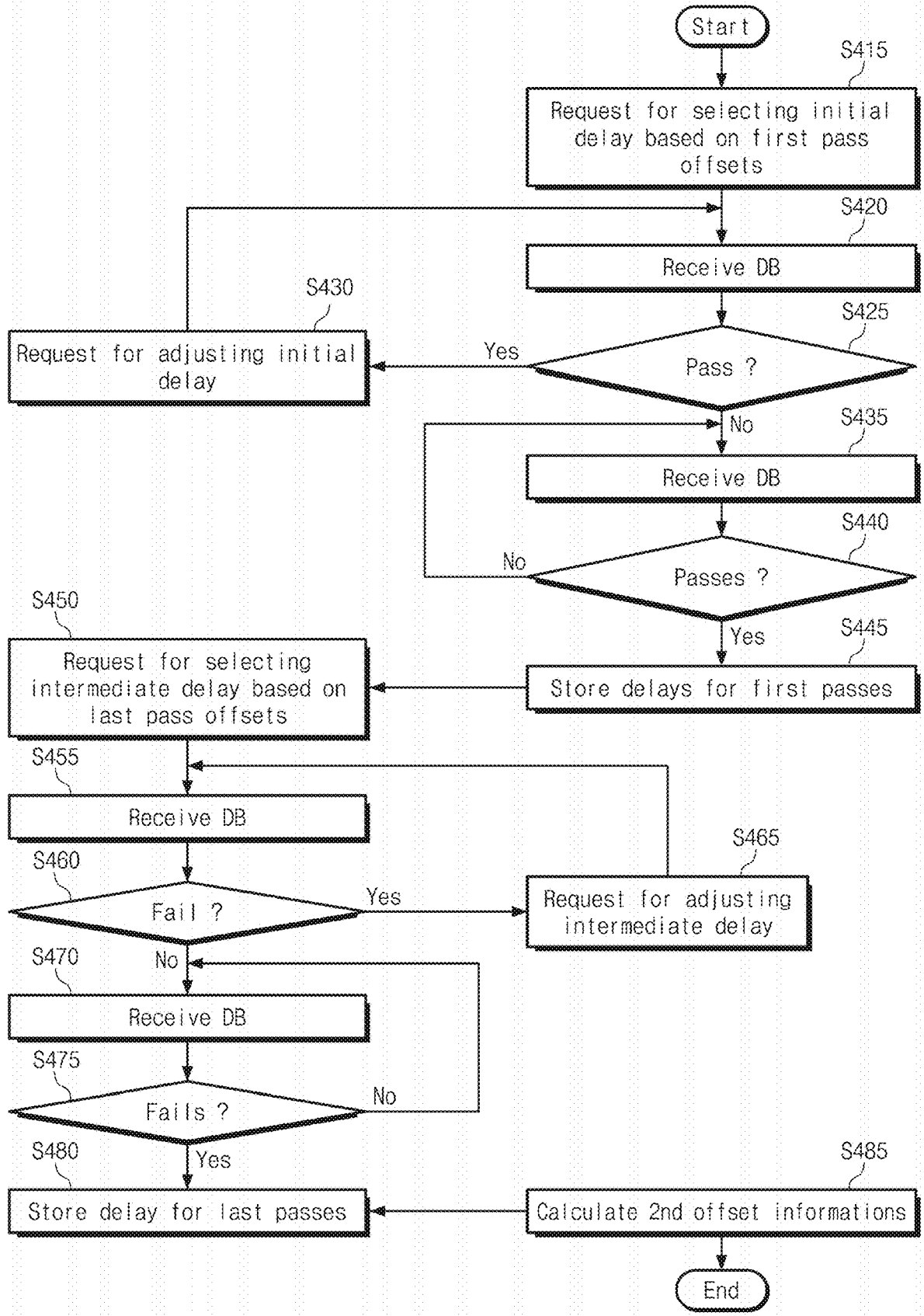
FIG. 12 is a flowchart illustrating an example in which the controller and the nonvolatile memory device perform first-step training.

FIG. 12 is a flowchart illustrating an example in which the controller 120 and the nonvolatile memory device 110b perform first-step training (e.g., the second training of FIG. 4). Referring to FIGS. 1, 2, 8, 9, and 11, in operation S415, the controller 120 may request the nonvolatile memory device 110b to select initial delays based on first pass offsets (e.g., delays) included in the pieces of first offset information.

The nonvolatile memory device 110b may set delays of the output delay circuits 114_1 to 114_8 to the initial delays depending on the pieces of first offset information. As another example, the nonvolatile memory device 110b may apply the margin to the initial delays included in the pieces of first offset information such that decreased or increased delays are set to the initial delays.

In operation S420, the controller 120 may receive the data bits DB from the nonvolatile memory device 110b. In operation S425, the controller 120 may determine whether passes are detected from first received data bits DB. As described with reference to FIG. 11, a first boundary may be determined only when a pass is detected after a fail.

If a pass is determined from the first data bits DB, the first boundary may not be determined at the data input and output line corresponding to the pass. Accordingly, if a pass is detected from a data bit first received through at least one data input and output line, in operation S430, the controller 120 may request the nonvolatile memory device 110b to readjust an initial delay of at least one corresponding output delay circuit.

If a pass is not detected from the data bit first received, that is, if fails are detected from first received data bits DB, operation S435 is performed. In operation S435, the controller 120 may receive the data bits DB from the nonvolatile memory device 110b. In operation S440, the controller 120 may determine whether first passes are detected.

If the first passes are not determined, in operation S435, the controller 120 may receive next data bits DB. The next data bits DB may have increased or decreased delays. Operation S435 and operation S440 may be repeated until the first passes are detected at the data input and output lines DQ1 to DQ8.

If the first passes are determined, first boundaries (e.g., start or end boundaries) of the data bits DB are detected. In operation S445, the controller 120 may store delays associated with the first passes. That is, the controller 120 may store delays corresponding to the first boundaries of the data bits DB.

In operation S450, the controller 120 may request the nonvolatile memory device 110b to select intermediate delays based on the last pass offsets (e.g., delays) included in the pieces of first offset information. The nonvolatile memory device 110b may set delays of the output delay circuits 114_1 to 114_8 to the intermediate delays depending on the pieces of first offset information. As another example, the nonvolatile memory device 110b may apply the margin to the intermediate delays included in the pieces of first offset information.

In operation S455, the controller 120 may receive the data bits DB. In operation S460, the controller 120 may determine whether a fail is detected from first received data bits DB. As described with reference to FIG. 11, a second boundary may be determined only when a fail is detected after a pass.

If a fail is determined from the first data bits DB after delays of the output delay circuits 114_1 to 114_8 are adjusted to the intermediate delays, the second boundary may not be determined at the data input and output line corresponding to the fail. Accordingly, if a fail is detected from a data bit first received through at least one data input and output line, in operation S465, the controller 120 may request the nonvolatile memory device 110b to readjust an intermediate delay of at least one corresponding output delay circuit.

If a fail is not detected from the first received data bits DB, that is, if passes are detected from the first received data bits DB, operation S470 is performed. In operation S470, the controller 120 may receive the data bits DB from the nonvolatile memory device 110b. In operation S475, the controller 120 may determine whether first fails (i.e., first fails since the corresponding first passes) are detected after the first passes.

If the first fails are not detected after the first passes, in operation S470, the controller 120 may receive next data bits DB. The next data bits DB may have increased or decreased delays. That is, operation S470 and operation S475 may be repeated until the first fails are detected at the data input and output lines DQ1 to DQ8 after the first passes.

If the first fails are determined after the first passes, second boundaries (e.g., end or start boundaries) of the data bits DB are detected. In operation S480, the controller 120 may store delays associated with the first fails after the first passes or delays associated with the last passes before fails. That is, the controller 120 may store delays corresponding to the second boundaries of the data bits DB.

In operation S485, the controller 120 may calculate the pieces of second offset information depending on the delays of the first boundaries and the delays of the second boundaries. Afterwards, as described with reference to FIG. 4, the controller 120 may send the pieces of second offset information to the nonvolatile memory device 110b. The nonvolatile memory device 110b may respectively adjust the delays of the output delay circuits 114_1 to 114_8 depending on the pieces of second offset information.

Figure 13:
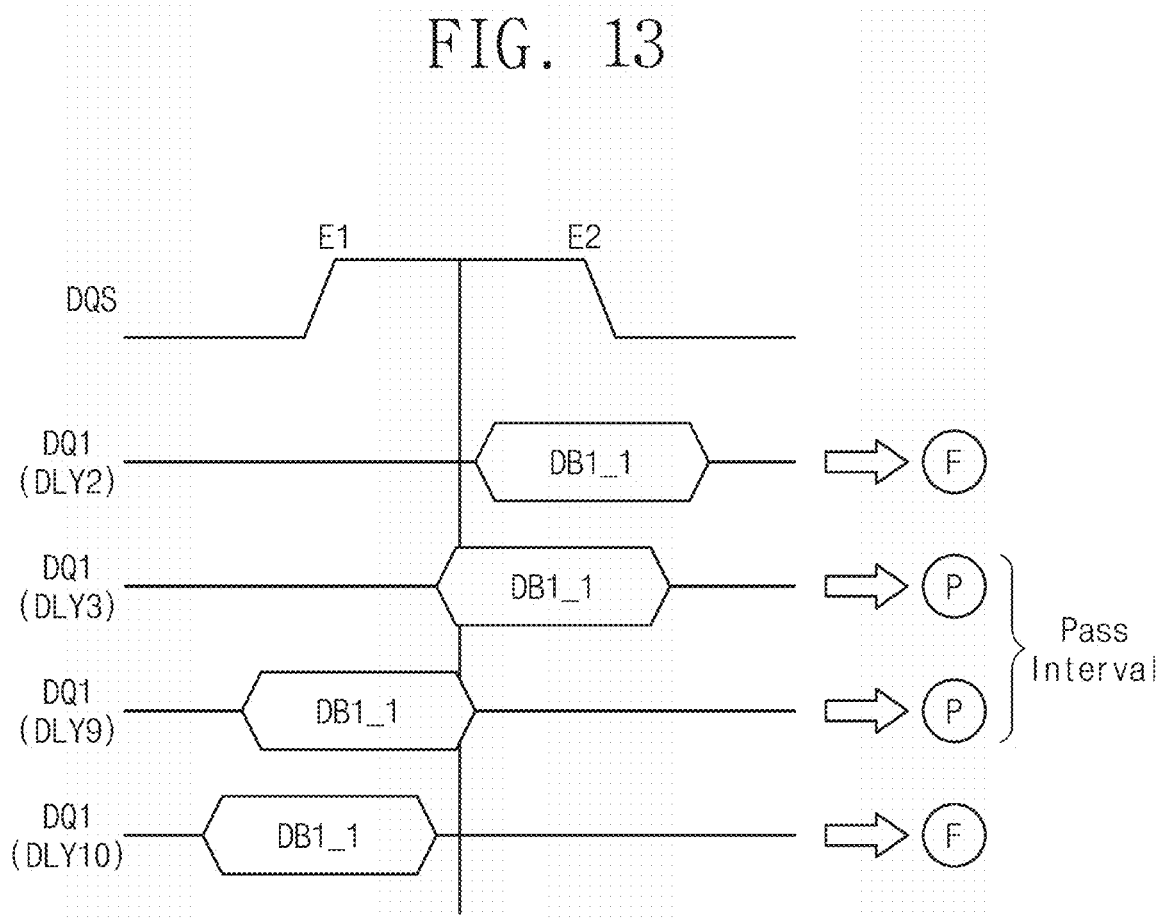
FIG. 13 illustrates an example in which pieces of second offset information are calculated according to a method of FIG. 12.

FIG. 13 illustrates an example in which pieces of second offset information are calculated according to a method of FIG. 12. According to at least one example embodiment of the inventive concepts, FIG. 13 illustrates an example in which the number of procedures illustrated in FIG. 11 decreases by applying the pieces of first offset information that were determined based on the procedures illustrated in FIG. 11. For example, according to at least some example embodiments, once first offset information has been determined with respect to a first memory device, a number of operations needed to determine first offset information with respect to subsequent memory devices may be reduced by utilizing the first offset information determined for the first memory device as a starting point. Referring to FIGS. 1, 2, 8, 9, 11, and 13, with regard to the first data input and output line DQ1, the pieces of first offset information may include the third delay DLY3 as a delay of a first boundary.

The nonvolatile memory device 110b may set the second delay DLY2, which is obtained by delaying the third delay DLY3 once more, to an initial delay such that a fail is detected at the first data input and output line DQ1 at first. Afterwards, the nonvolatile memory device 110b may repeatedly send a bit DB1_1 while adjusting a delay. The controller 120 may detect a first boundary from the bit DB1_1 that has a varying delay and is repeatedly received.

As illustrated in FIG. FIG. 13, a fail "F" is detected from the bit DB1_1 received in the controller 120 with the second delay DLY2, and a pass "P" is detected from the bit DB1_1 received in the controller 120 with the third delay DLY3. The controller 120 may determine the first boundary from the bits DB1_1 having the second and third delays DLY2 and DLY3.

That is, if the nonvolatile memory device 110b sets an initial delay based on the pieces of first offset information, the first boundary of the first data input and output line DQ1 is detected by sending the bit DB1_1 two times. In the example described with reference to FIG. 11, compared with the case where the bit DB1_1 is sent three times until the first boundary is determined, the number of times that the bit DB1_1 is sent decreases by the pieces of first offset information.

After the first boundary is determined, the controller 120 may request the nonvolatile memory device 110b to adjust delays of the output delay circuits 114_1 to 114_8 to intermediate delays. As illustrated in FIG. 11, with regard to the first data input and output line DQ1, the pieces of first offset information may include the tenth delay DLY10 as a delay of a second boundary. The nonvolatile memory device 110b may set the ninth delay DLY9, which is obtained by delaying the tenth delay DLY10 once more, to an intermediate delay such that a pass is detected at the first data input and output line DQ1 at first.

Afterwards, the nonvolatile memory device 110b may repeatedly send the bit DB1_1 while adjusting a delay. The controller 120 may detect a second boundary from the bit DB1_1 that has a varying delay and is repeatedly received. As illustrated in FIG. FIG. 13, a pass "P" is detected from the bit DB1_1 received in the controller 120 with the ninth delay DLY9, and a fail "F" is detected from the bit DB1_1 received in the controller 120 with the tenth delay DLY10. The controller 120 may determine the second boundary from the bits DB1_1 having the ninth and tenth delays DLY9 and DLY10.

That is, if the nonvolatile memory device 110b sets an intermediate delay based on the pieces of first offset information, the second boundary of the first data input and output line DQ1 is detected by sending the bit DB1_1 two times. In the example described with reference to FIG. 11, compared with the case where the bit DB1_1 is sent seven times until the second boundary is determined after the first boundary is determined, the number of times that the bit DB1_1 is sent decreases by the pieces of first offset information.

The training operation described with reference to FIG. 13 may be equally performed with respect to the remaining data input and output lines DQ2 to DQ8. For example, the training operation may be performed on the data input and output lines DQ1 to DQ8 independently of each other, in parallel, or individually (e.g., simultaneously). Through the training operation, the controller 120 may detect timings of the data bits DB and may detect the pieces of second offset information for aligning data bits.

Figure 14:
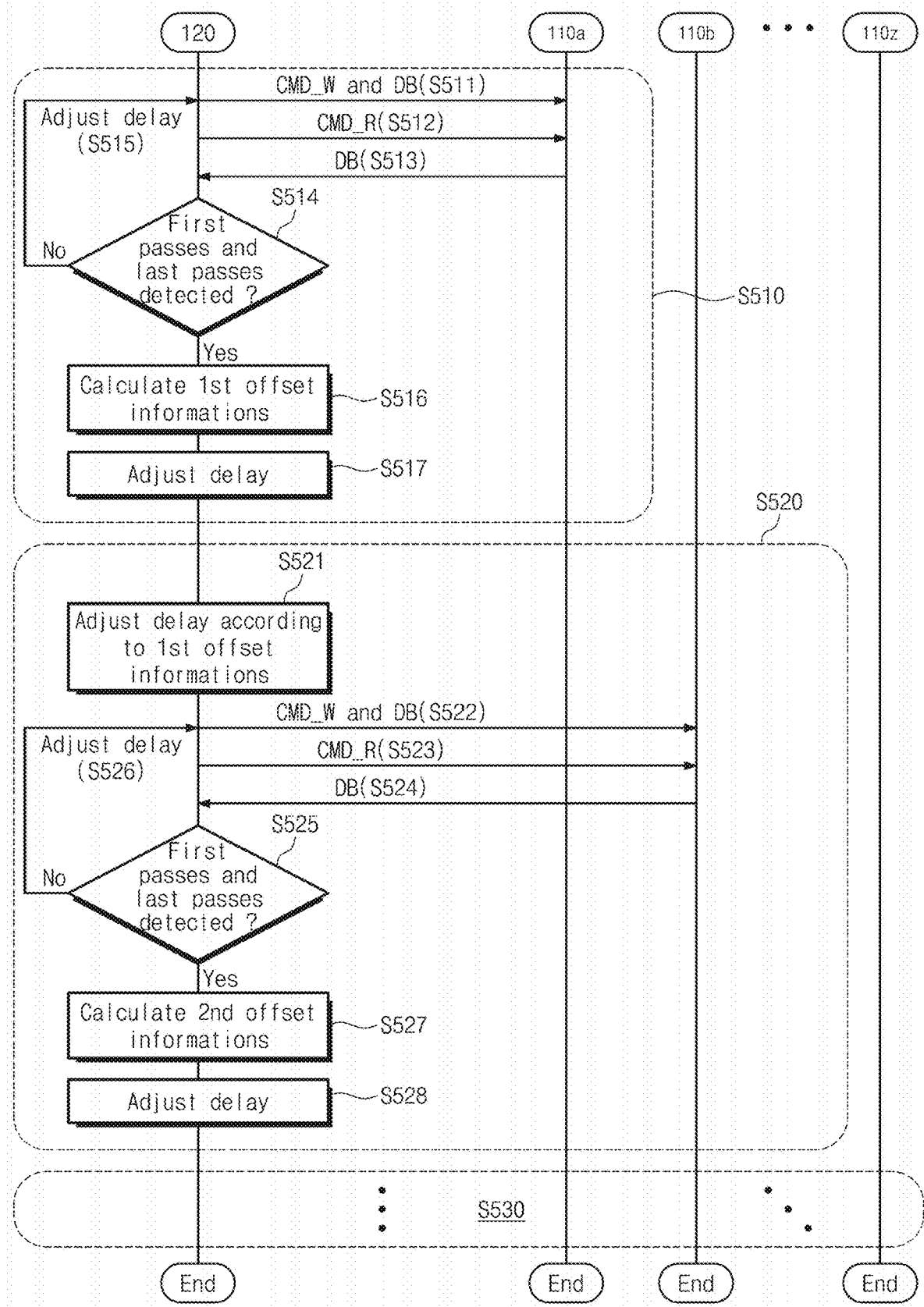
FIG. 14 is a flowchart illustrating an example in which second-step training according to at least some example embodiments of the inventive concepts is performed.

FIG. 14 is a flowchart illustrating an example in which second-step training according to at least some example embodiments of the inventive concepts is performed. According to at least one example embodiment of the inventive concepts, the second-step training may include input training or write training for aligning timings to send data bits that the controller 120 sends to the nonvolatile memory devices 110a to 110z through the data input and output lines DQ1 to DQ8.

Referring to FIGS. 1, 2, and 14, in operation S510, the first training is performed on the representative nonvolatile memory device 110a. In detail, in operation S511, the controller 120 may send a write command CMD_W and data bits DB to the representative nonvolatile memory device 110a. For example, the write command CMD_W may be sent through the data input and output lines DQ1 to DQ8 in the form of a command, and the data bits DB may be sent through the data input and output lines DQ1 to DQ8 in the form of data. The data bits DB may include a specific data pattern stored in the memory 123.

In operation S512, the controller 120 may send a read command CMD_R to the representative nonvolatile memory device 110a. For example, the read command CMD_R may request a read operation for the data bits DB written in operation S511. In response to the read command CMD_R, in operation S513, the representative nonvolatile memory device 110a may send the data bits DB to the controller 120 through the data input and output lines DQ1 to DQ8. The data bits DB may be sent in the form of data.

For example, the representative nonvolatile memory device 110a may write the data bits DB received in operation S511 in the memory cell array 111. In response to the read command CMD_R received in operation S512, the representative nonvolatile memory device 110a may read the data bits DB from the memory cell array 111 and may send the read data bits DB to the controller 120.

As another example, the representative nonvolatile memory device 110a may store the data bits DB received in operation S511 in the buffer 114_9 (refer to FIG. 8) of the input and output circuit 114 without writing the received data bits DB in the memory cell array 111. In response to the read command CMD_R received in operation S512, the representative nonvolatile memory device 110a may send the data bits DB stored in the buffer 114_9 to the controller 120. For example, the write command CMD_W and the read command CMD_R may be commands selected for training and may be different from normal write and read commands.

In operation S514, the controller 120 may determine whether first passes and last passes are detected at the data input and output lines DQ1 to DQ8. If the first passes and the last passes are not detected, in operation S515, the controller 120 may adjust delays to send the data bits DB. Afterwards, the controller 120 may perform operation S511 to operation S514.

That is, until the first passes and the last passes are detected from the data bits DB received from the representative nonvolatile memory device 110a, the controller 120 may repeat an operation of sending the data bits DB to the representative nonvolatile memory device 110a while varying the delays of the data bits DB and receiving the data bits DB from the representative nonvolatile memory device 110a.

If the first passes and the last passes are detected, operation S516 is performed. In operation S516, the controller 120 may calculate the pieces of first offset information. The pieces of first offset information may include delays of the data input and output lines DQ1 to DQ8, which are needed for the controller 120 to send aligned data bits DB to the representative nonvolatile memory device 110a through the data input and output lines DQ1 to DQ8. The pieces of first offset information may be stored in the controller 120, for example, the memory 123.

In operation S517, the controller 120 may adjust input delays depending on the pieces of first offset information. For example, the controller 120 may align timings to input the data bits DB to the representative nonvolatile memory device 110a through the data input and output lines DQ1 to DQ8.

After the first training associated with the representative nonvolatile memory device 110a is completed, the second training may be performed on the remaining nonvolatile memory devices 110b to 110z. For example, in operation S520, the second training may be performed on the nonvolatile memory device 110b. In detail, in operation S521, the controller 120 may adjust timings (e.g., delays) to send the data bits DB through the data input and output lines DQ1 to DQ8 depending on the pieces of first offset information.

In operation S522, the controller 120 may send the write command CMD_W and the data bits DB to the nonvolatile memory device 110b. In operation S523, the controller 120 may send the read command CMD_R to the nonvolatile memory device 110b. In response to the read command CMD_R, in operation S524, the nonvolatile memory device 110b may send the data bits DB to the controller 120 through the data input and output lines DQ1 to DQ8.

In operation S525, the controller 120 may determine whether first passes and last passes are detected at the data input and output lines DQ1 to DQ8. If the first passes and the last passes are not detected, in operation S526, the controller 120 may adjust delays to send the data bits DB. Afterwards, the controller 120 may perform operation S522 to operation S525.

For example, as described with reference to FIG. 12, the second training may include an operation of adjusting delays to initial delays and detecting the first passes and an operation of adjusting delays to intermediate delays and detecting the last passes. This will be more fully described later.

If the first passes and the last passes are detected, operation S527 is performed. In operation S527, the controller 120 may calculate the pieces of second offset information. The pieces of second offset information may include delays of the data input and output lines DQ1 to DQ8, which are needed for the controller 120 to send aligned data bits DB to the nonvolatile memory device 110b through the data input and output lines DQ1 to DQ8.

In operation S528, the controller 120 may adjust input delays depending on the pieces of second offset information. For example, the controller 120 may align timings to input the data bits DB to the nonvolatile memory device 110b through the data input and output lines DQ1 to DQ8.

Afterwards, in operation S530, the second training associated with the remaining nonvolatile memory devices may continue. The second training associated with the remaining nonvolatile memory devices may be performed the same as operation S520. Accordingly, a description of the second training associated with the remaining nonvolatile memory devices will not be repeated here.

Figure 15:
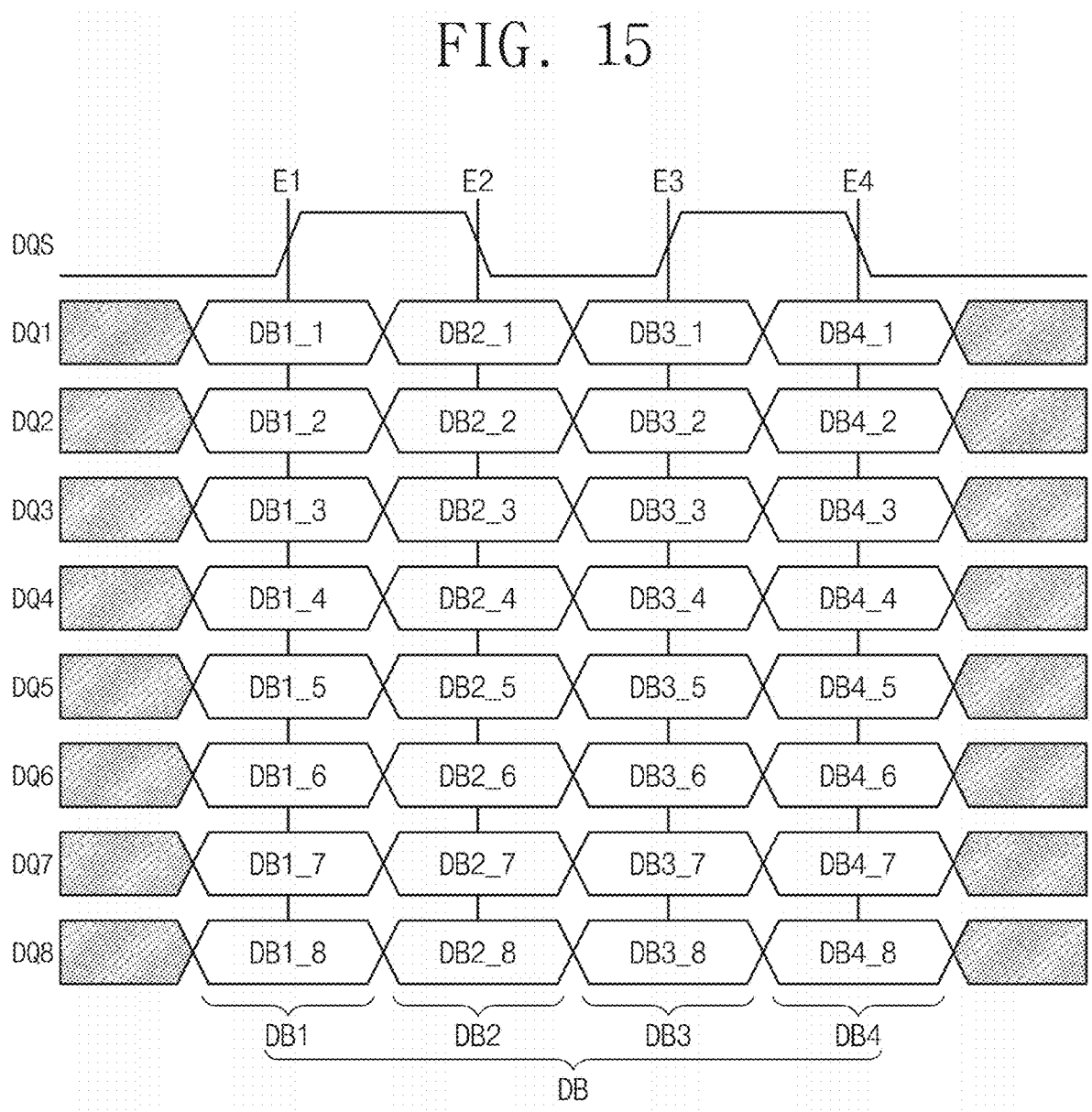
FIG. 15 illustrates an example in which the controller sends data bits to nonvolatile memory devices.

FIG. 15 illustrates an example in which the controller 120 sends the data bits DB to the nonvolatile memory devices 110a to 110z. Referring to FIGS. 1, 2, and 15, the data bits DB may be sent through the data input and output lines DQ1 to DQ8 in synchronization with the data strobe signal DQS. The data strobe signal DQS may be toggled by the controller 120.

The data bits DB may be sent in synchronization with rising and falling edges E1 to E4 of the data strobe signal DQS. The data bits DB may include the first to fourth data bits DB1 to DB4 that are sent in synchronization with the first to fourth edges E1 to E4 of the data strobe signal DQS.

The first data bits DB1 may include the first bits DB1_1 to DB1_8 respectively sent through the data input and output lines DQ1 to DQ8. Likewise, the second data bits DB2, the third data bits DB3, and the fourth data bits DB4 may include second bits DB2_1 to DB2_8, third bits DB3_1 to DB3_8, and fourth bits DB4_1 to DB4_8.

Figure 16:
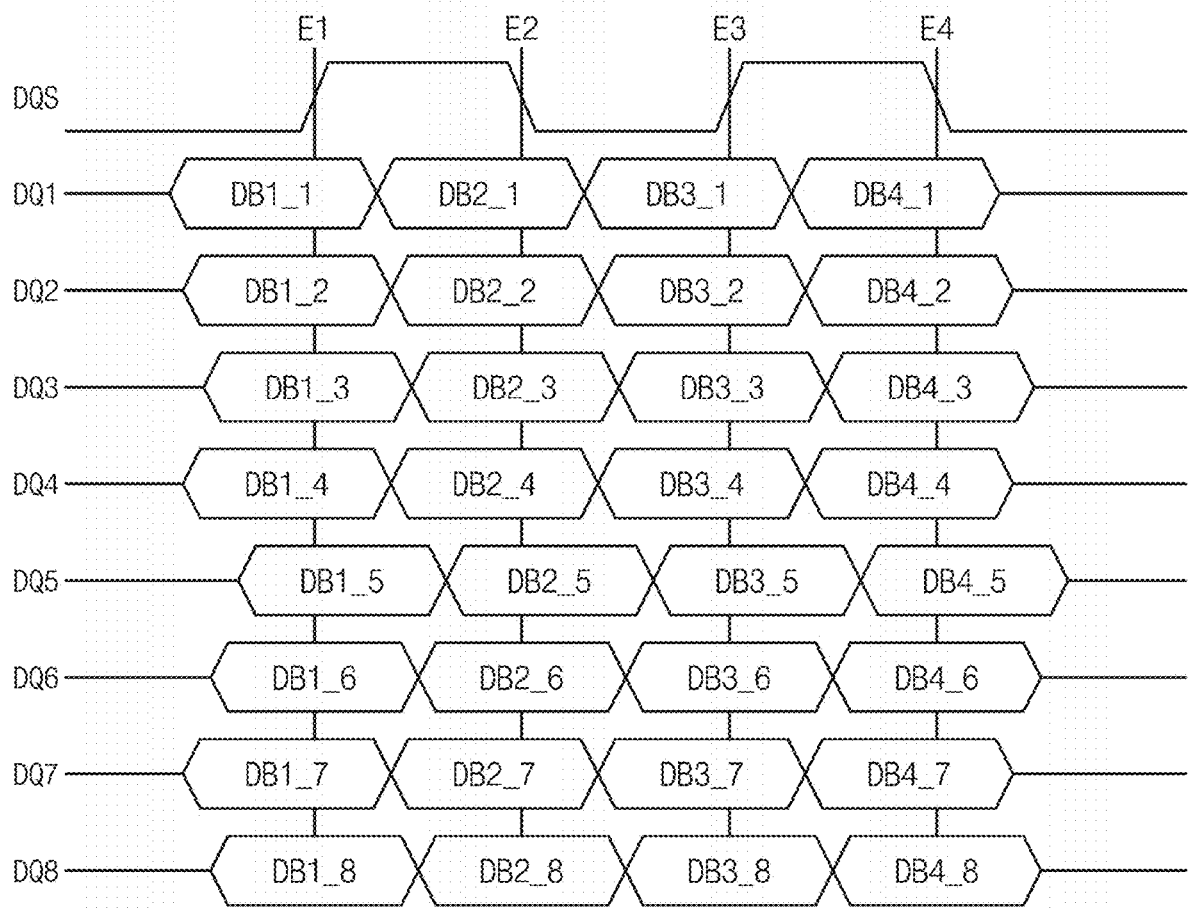
FIG. 16 illustrates an example in which data bits of FIG. 15 are received, for example, by a representative nonvolatile memory device.

FIG. 16 illustrates an example in which the data bits DB of FIG. 15 are received, for example, by the representative nonvolatile memory device 110a. According to at least one example embodiment of the inventive concepts, timings of the data bits DB received by the representative nonvolatile memory device 110a may be different from timings (refer to FIG. 15) of the data bits DB that the controller 120 sends, due to various environment factors such as parasitic resistance, parasitic capacitance, parasitic inductance, temperature, or humidity.

Referring to FIGS. 1, 2, and 16, the input and output circuit 114 may store (or latch) the data bits DB in synchronization with the first to fourth edges E1 to E4 of the data strobe signal DQS. Timings (e.g., timings of centers) of bits DB1_1 to DB4_1 sent through the first data input and output line DQ1 may be advanced with respect to timings of edges of the data strobe signal DQS.

Timings of bits DB1_2 to DB4_2 sent through the second data input and output line DQ2 may be advanced with respect to timings of the edges of the data strobe signal DQS. Timings of bits DB1_3 to DB4_3 sent through the third data input and output line DQ3 may be matched with respect to timings of the edges of the data strobe signal DQS.

Timings of bits DB1_4 to DB4_4 sent through the fourth data input and output line DQ4 may be advanced with respect to timings of the edges of the data strobe signal DQS. Timings of bits DB1_5 to DB4_5 sent through the fifth data input and output line DQ5 may be delayed with respect to timings of the edges of the data strobe signal DQS. Timings of bits DB1_6 to DB4_6 sent through the sixth data input and output line DQ6 may be matched with respect to timings of the edges of the data strobe signal DQS.

Timings of bits DB1_7 to DB4_7 sent through the seventh data input and output line DQ7 may be advanced with respect to timings of the edges of the data strobe signal DQS. Timings of bits DB1_8 to DB4_8 sent through the eighth data input and output line DQ8 may be matched with respect to timings of the edges of the data strobe signal DQS. Timings of data bits sent through the data input and output lines DQ1 to DQ8 may not be matched with each other.

To compensate for differences between timings illustrated in FIGS. 15 and 16, the controller 120 may adjust timings to send the data bits DB. For example, the controller 120 may perform training with the nonvolatile memory devices 110a to 110z to detect appropriate transmission timings (or delays) and may adjust transmission timings (or delays) depending on the detection result.

Figure 17:
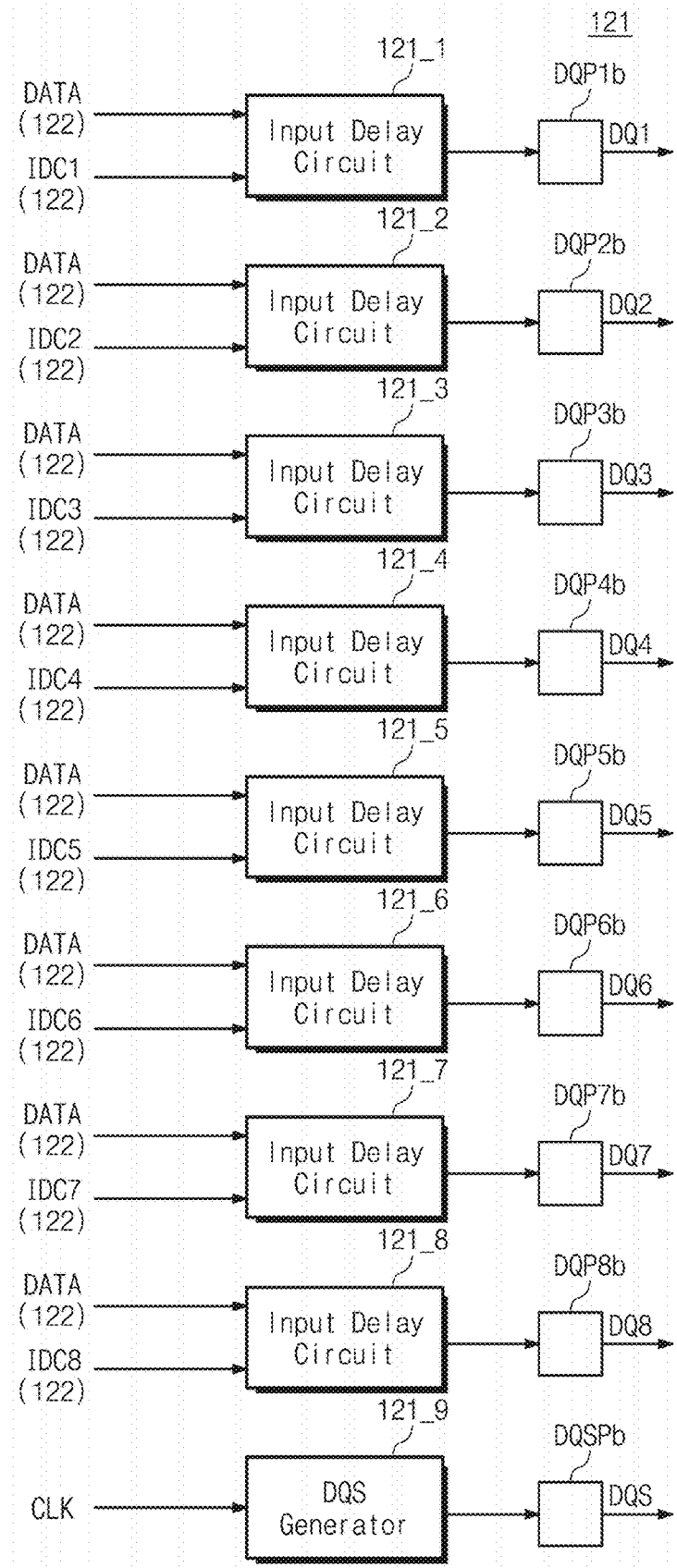
FIG. 17 illustrates an example of a memory interface of the controller.

FIG. 17 illustrates an example of the memory interface 121 of the controller 120. Referring to FIGS. 1 and 17, the memory interface 121 includes data input and output pads DQP1b to DQP8b, a data strobe pad DQSPb, input delay circuits 121_1 to 121_8, and a data strobe signal (DQS) generator 121_9.

The data input and output pads DQP1b to DQP8b may send the data input and output signals DQ1 to DQ8. One or more example embodiments of the inventive concepts will be explained with reference to an example in which it is assumed that the data input and output pads DQP1b to DQP8b input the data input and output signals DQ1 to DQ8 to the nonvolatile memory devices 110a to 110z.

However, it may be understood that, according to at least some example embodiments of the inventive concepts, the data input and output pads DQP1b to DQP8b receive the data input and output signals DQ1 to DQ8 from the nonvolatile memory devices 110a to 110z and components for processing the received data input and output signals DQ1 to DQ8 are provided in the memory interface 121.

The data strobe pad DQSPb may send the data strobe signal DQS. One or more example embodiments of the inventive concepts will be explained with reference to an example in which it is assumed that the data strobe pad DQSPb inputs the data strobe signal DQS to the nonvolatile memory devices 110a to 110z.

However, it may be understood that, according to at least some example embodiments of the inventive concepts, the data strobe pad DQSPb receives the data strobe signal DQS from the nonvolatile memory devices 110a 110z and components for processing the received data strobe signal DQS are provided in the memory interface 121.

The input delay circuits 121_1 to 121_8 are respectively connected to the data input and output pads DQP1b to DQP8b. The input delay circuits 121_1 to 121_8 may send data bits provided through the input and output trainer 122 from the memory 123 to the data input and output pads DQP1b to DQP8b, respectively. The input delay circuits 121_1 to 121_8 may receive input delay control signals IDC1 to IDC8 sent from the input and output trainer 122, respectively.

The input delay circuits 121_1 to 121_8 may individually control timings (or delays) to input data bits in response to the input delay control signals IDC1 to IDC8. For example, the first input delay circuit 121_1 may adjust a timing (delay) to send a data bit from the input and output trainer 122 in response to the first input delay control signal IDC1. According to at least one example embodiment of the inventive concepts, the input delay circuits 121_1 to 121_8 may have the same structure as illustrated in FIG. 9.

The data strobe signal generator 121_9 may receive a clock CLK. The clock CLK may be generated within the controller 120 or may be supplied from an external device to the controller 120. The data strobe signal generator 121_9 may generate the data strobe signal DQS by using the clock CLK. The data strobe signal DQS may be input to the representative nonvolatile memory device 110a through the data strobe pad DQSPb.

According to at least one example embodiment of the inventive concepts, components that generate various signals, such as the read enable signal /RE, the write enable signal /WE, and the like, by using the clock CLK may be provided to the memory interface 121. However, for ease of description, one or more of such components may not be discussed in great detail in the present disclosure.

Figure 18:
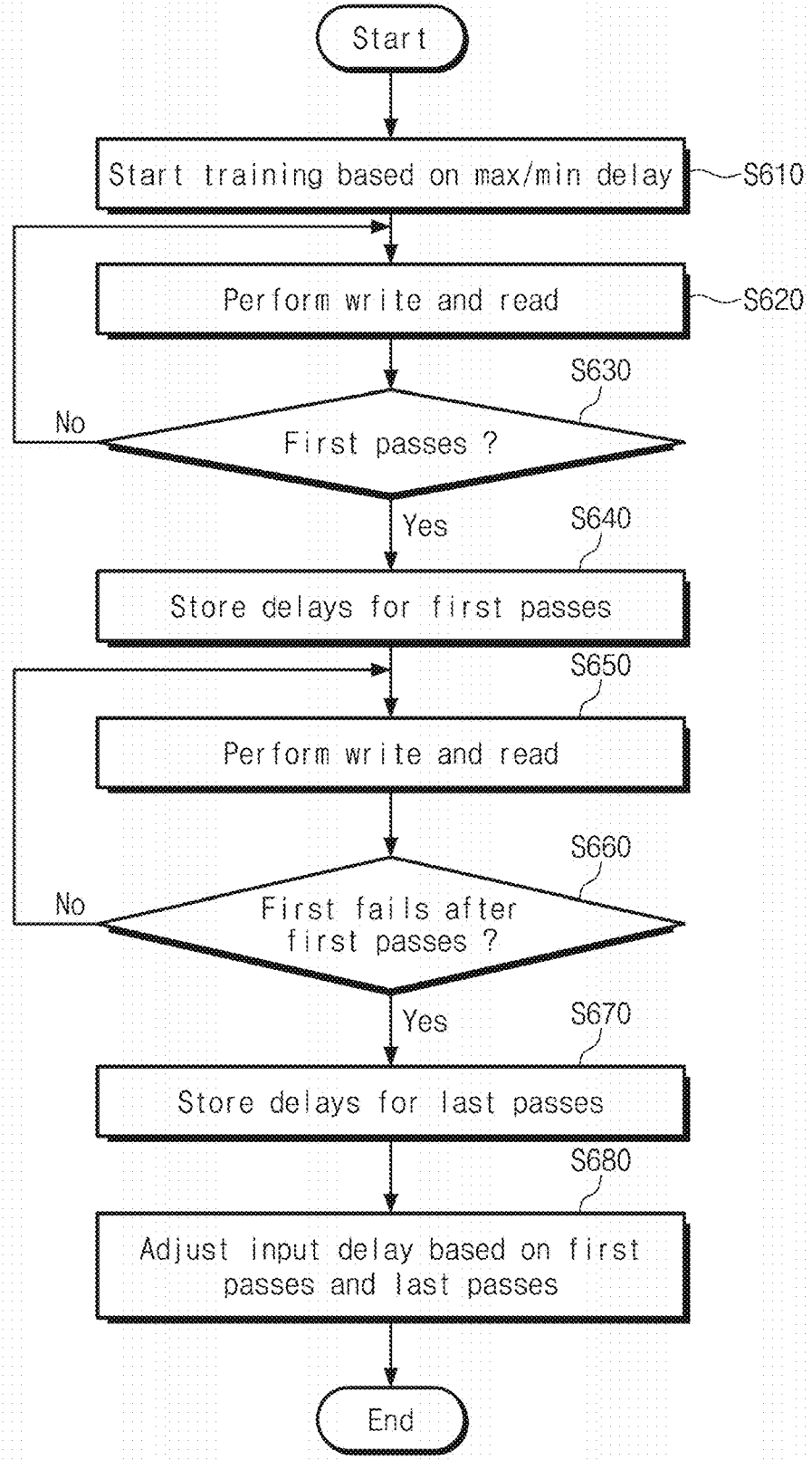
FIG. 18 is a flowchart illustrating an example in which the controller and the representative nonvolatile memory device perform second-step training.

FIG. 18 is a flowchart illustrating an example in which the controller 120 and the representative nonvolatile memory device 110a perform second-step training. Referring to FIGS. 1, 2, 17, and 18, in operation S610, the controller 120 and the representative nonvolatile memory device 110a may start training based on maximum/minimum delays. For example, delays of the input delay circuits 121_1 to 121_8 may be set to the maximum delays or the minimum delays. According to at least some example embodiments, the maximum delay may be a longest delay the delay circuits 121_1 to 121_8 are capable of applying to input signals and may be determined, for example, based on attributes of the delay circuits 121_1 to 121_8. According to at least some example embodiments, the minimum delay may be a shortest delay the delay circuits 121_1 to 121_8 are capable of applying to input signals and may be determined, for example, based on attributes of the delay circuits 121_1 to 121_8.

In operation S620, the controller 120 may perform write and read operations of the data bits DB on the representative nonvolatile memory device 110a. In operation S630, the controller 120 may determine whether first passes are detected. For example, when a valid value (or information) is received through a specific data input and output line in the controller 120, the controller 120 may determine that the specific data input and output line is passed.

For example, the valid value may be a value of a relevant bit of the data bits DB that the controller 120 sends to the representative nonvolatile memory device 110a. That is, after the controller 120 sends a specific data bit to the representative nonvolatile memory device 110a through the specific data input and output line (e.g., in the form of a command), if a specific bit is received through the specific data input and output line in the controller 120, the specific data input and output line may be determined as being passed.

If the first passes are not determined, in operation S620, the controller 120 may perform next write and read operations. The next write and read operations may be performed under the condition that delays of the data bits DB increase or decrease. Operation S620 and operation S630 may be repeated until the first passes are detected at the data input and output lines DQ1 to DQ8.

If the first passes are determined, first boundaries (e.g., start or end boundaries) of the data bits DB are detected. In operation S640, the controller 120 may store delays associated with the first passes. That is, the controller 120 may store delays corresponding to the first boundaries of the data bits DB.

In operation S650, the controller 120 may perform write and read operations of the data bits DB on the representative nonvolatile memory device 110a. In operation S660, the controller 120 may determine whether first fails (i.e., first fails since the corresponding first passes) are detected after the first passes. Unlike the pass, if a valid value is not received through the specific data input and output line in the controller 120, that is, if an invalid value is received, it is determined that the specific data input and output line fails.

If the first fails are not detected after the first passes, in operation S650, the controller 120 may perform next write and read operations. The next write and read operations may be performed under the condition that delays of the data bits DB increase or decrease. That is, operation S650 and operation S660 may be repeated until the first fails are detected at the data input and output lines DQ1 to DQ8 after the first passes.

If the first fails are determined after the first passes, second boundaries (e.g., end or start boundaries) of the data bits DB are detected. In operation S670, the controller 120 may store delays associated with the first fails after the first passes or delays associated with the last passes before fails. That is, the controller 120 may store delays corresponding to the second boundaries of the data bits DB.

In operation S680, the controller 120 may calculate the pieces of first offset information depending on the delays of the first boundaries and the delays of the second boundaries. Afterwards, as described with reference to FIG. 10, the controller 120 may adjust delays of the input delay circuits 121_1 to 121_8 associated with the representative nonvolatile memory device 110a by using the pieces of first offset information.

Figure 19:
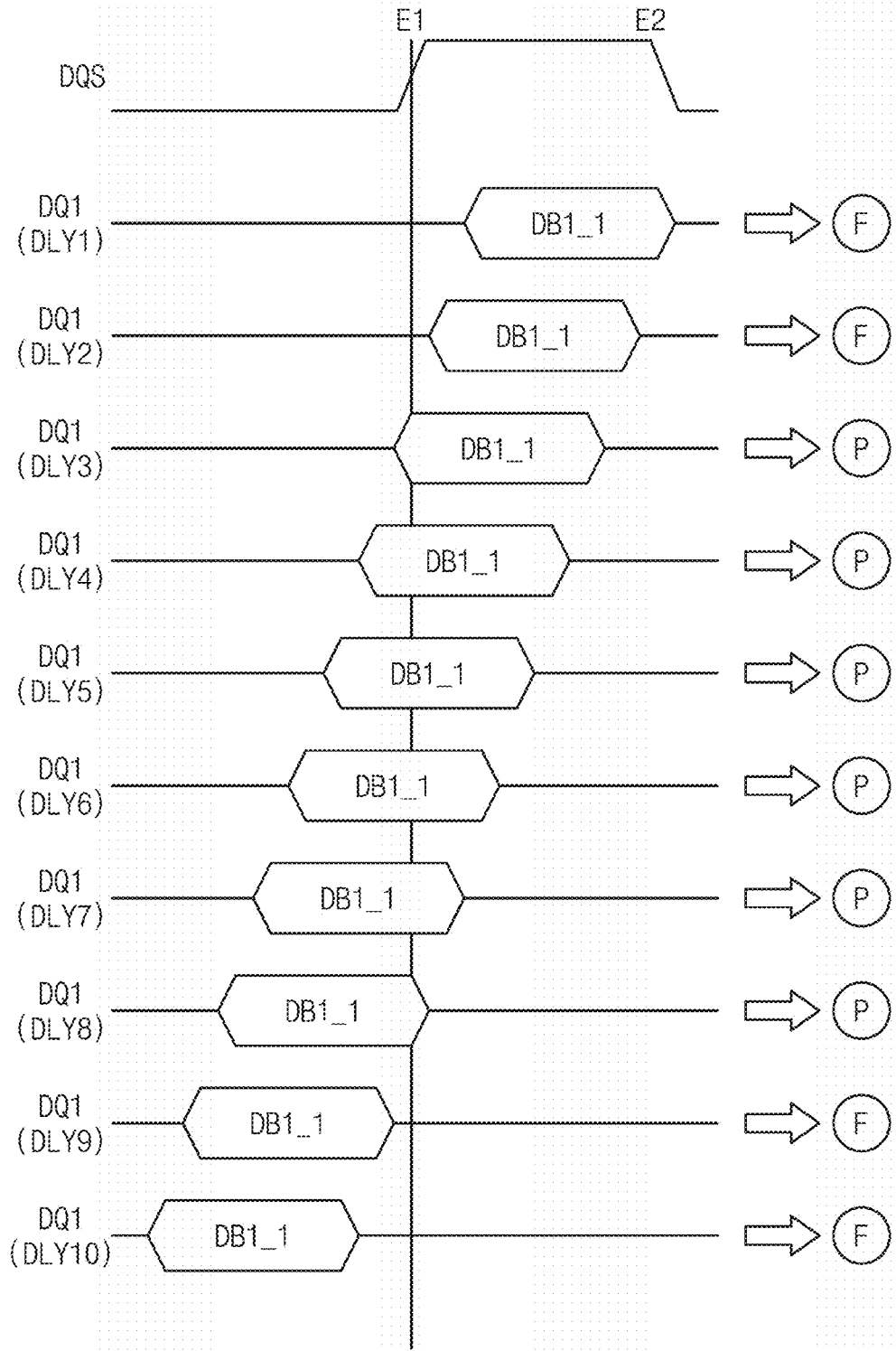
FIG. 19 illustrates an example in which pieces of first offset information are calculated according to a method of FIG. 18.

FIG. 19 illustrates an example in which pieces of first offset information are calculated according to a method of FIG. 18. According to at least one example embodiment of the inventive concepts, an example in which a first bit DB1_1 is received with different delays through the first data input and output line DQ1 from the controller 120 at the representative nonvolatile memory device 110a is illustrated in FIG. 19. In FIG. 19, it is assumed that a delay decreases from a first delay DLY1 to a tenth delay DLY10 toward the bottom.

Referring to FIGS. 1, 2, 17, and 19, when the data strobe signal DQS has a first edge E1 in the representative nonvolatile memory device 110a, a bit DB1_1 received with the first delay DLY1 has an invalid value (or information). Accordingly, the representative nonvolatile memory device 110a may write or store an invalid value. When the controller 120 requests a read operation, the representative nonvolatile memory device 110a may send the invalid value to the controller 120. That is, the controller 120 may determine the bit DB1_1 having the first delay DLY1 as the fail "F".

When the data strobe signal DQS has the first edge E1 in the representative nonvolatile memory device 110a, the bit DB1_1 received with the second delay DLY2 has an invalid value. That is, the controller 120 may determine the bit DB1_1 having the second delay DLY2 as the fail "F".

When the data strobe signal DQS has the first edge E1 in the representative nonvolatile memory device 110a, the bit DB1_1 received with the third delay DLY3 has a valid value. That is, the controller 120 may determine the bit DB1_1 having the third delay DLY3 as the pass "P".

When the data strobe signal DQS has the first edge E1 in the representative nonvolatile memory device 110a, the bit DB1_1 received with the fourth to eighth delays DLY4 to DLY8 has a valid value. Accordingly, the controller 120 may determine the bits DB1_1 having the fourth to eighth delays DLY4 to DLY8 as the pass "P".

When the data strobe signal DQS has the first edge E1 in the representative nonvolatile memory device 110a, the bit DB1_1 received with the ninth delay DLY9 and the tenth delay DLY10 has invalid values. Accordingly, the controller 120 may determine the bit DB1_1 having the ninth delay DLY9 and the tenth delay DLY10 as the fail "F".

As illustrated in FIG. 19, when a first pass is determined according to the third delay DLY3, a first boundary (e.g., a start boundary) of the bit DB1_1 is detected. The controller 120 may store the third delay DLY3 in relation to the first boundary. As another example, the controller 120 may not directly store the third delay DLY3, but it may store which bit corresponds to a first pass.

When a first fail (i.e., since the corresponding first pass) is determined according to the ninth delay DLY9 after the first pass, a second boundary (e.g., an end boundary) of the bit DB1_1 is detected. The controller 120 may store the ninth delay DLY9 or the eighth delay DLY8 in relation to the second boundary of the bit DB1_1. As another example, the controller 120 may not directly store the ninth delay DLY9 or the eighth delay DLY8, but it may store which bit corresponds to a first fail (or the last pass) after the first pass.

The controller 120 may calculate an average (or an intermediate value) of a delay associated with the first boundary and a delay associated with the second boundary and may store the calculated delay as the first offset information. The controller 120 may store the delay associated with the first boundary and the delay associated with the second boundary as the first offset information.

The training operation described with reference to FIG. 19 may be equally performed with respect to the remaining data input and output lines DQ2 to DQ8. For example, the training operation may be performed on the data input and output lines DQ1 to DQ8 independently of each other, in parallel, or individually (e.g., simultaneously). Through the training operation, the controller 120 may detect timings of the data bits DB and may detect the pieces of first offset information for aligning data bits.

An example in which training is performed while sequentially advancing the bit DB1_1 is illustrated in FIG. 19. However, at least some example embodiments of the inventive concepts may be changed or applied such that training is performed while sequentially delaying the bit DB1_1. According to at least one example embodiment of the inventive concepts, as the second boundaries are detected, the controller 120 may ignore the remaining delays that are not yet applied and may terminate the training with the representative nonvolatile memory device 110a.

Figure 20:
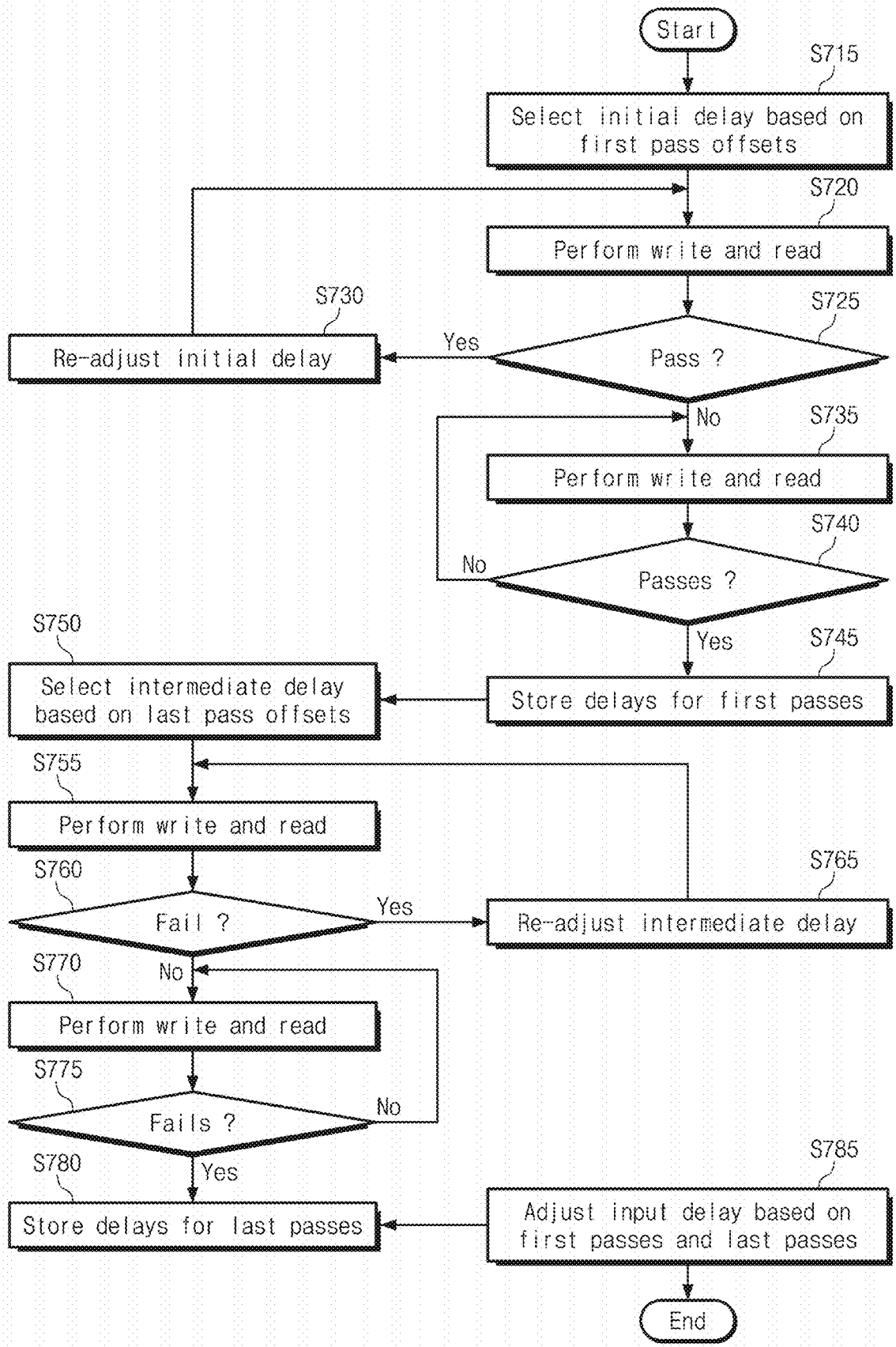
FIG. 20 is a flowchart illustrating an example in which the controller and the nonvolatile memory device perform second-step training.

FIG. 20 is a flowchart illustrating an example in which the controller 120 and the nonvolatile memory device 110b perform second-step training. Referring to FIGS. 1, 2, 17, and 20, in operation S715, the controller 120 may select initial delays based on first pass offsets (e.g., delays) included in the pieces of first offset information.

The controller 120 may set delays of the input delay circuits 121_1 to 121_8 to the initial delays depending on the pieces of first offset information. As another example, the controller 120 may apply the margin to the initial delays included in the pieces of first offset information such that decreased or increased delays are set to the initial delays.

In operation S720, the controller 120 may perform write and read operations of the data bits DB on the nonvolatile memory device 110b. In operation S725, the controller 120 may determine whether passes are detected from first received data bits DB. As described with reference to FIG. 19, a first boundary may be determined only when a pass is detected after a fail.

If a pass is determined from the first data bits DB, the first boundary may not be determined at the data input and output line corresponding to the pass. Accordingly, if a pass is detected from a data bit first received through at least one data input and output line, in operation S730, the controller 120 may readjust an initial delay of at least one corresponding input delay circuit.

If a pass is not detected from the data bit first received, that is, if fails are detected from first received data bits DB, operation S735 is performed. In operation S735, the controller 120 may perform write and read operations of the data bits DB on the nonvolatile memory device 110b. In operation S740, the controller 120 may determine whether first passes are detected.

If the first passes are not determined, in operation S735, the controller 120 may perform next write and read operations. The next write and read operations may be performed under the condition that delays of the data bits DB increase or decrease. Operation S735 and operation S740 may be repeated until the first passes are detected at the data input and output lines DQ1 to DQ8.

If the first passes are determined, first boundaries (e.g., start or end boundaries) of the data bits DB are detected. In operation S745, the controller 120 may store delays associated with the first passes. That is, the controller 120 may store delays corresponding to the first boundaries of the data bits DB.

In operation S750, the controller 120 may select intermediate delays based on the last pass offsets (e.g., delays) included in the pieces of first offset information. The controller 120 may set delays of the input delay circuits 121_1 to 121_8 to the intermediate delays depending on the pieces of first offset information. As another example, the controller 120 may apply the margin to the intermediate delays included in the pieces of first offset information.

In operation S755, the controller 120 may perform write and read operations of the data bits DB on the nonvolatile memory device 110b. In operation S760, the controller 120 may determine whether a fail is detected from first received data bits DB. As described with reference to FIG. 19, a second boundary may be determined only when a fail is detected after a pass.

If a fail is determined from the first data bits DB after delays of the input delay circuits 121_1 to 121_8 are adjusted to the intermediate delays, the second boundary may not be determined at the data input and output line corresponding to the fail. Accordingly, if a fail is detected from a data bit first received through at least one data input and output line, in operation S765, the controller 120 may readjust an intermediate delay of at least one corresponding output delay circuit.

If a fail is not detected from the first received data bits DB, that is, if passes are detected from the first received data bits DB, operation S770 is performed. In operation S770, the controller 120 may perform write and read operations of the data bits DB on the nonvolatile memory device 110b. In operation S775, the controller 120 may determine whether first fails (i.e., first fails since the corresponding first passes) are detected after the first passes.

If the first fails are not detected after the first passes, in operation S770, the controller 120 may perform next write and read operations. The next write and read operations may be performed under the condition that delays of the data bits DB increase or decrease. That is, operation S770 and operation S775 may be repeated until the first fails are detected at the data input and output lines DQ1 to DQ8 after the first passes.

If the first fails are determined after the first passes, second boundaries (e.g., end or start boundaries) of the data bits DB are detected. In operation S780, the controller 120 may store delays associated with the first fails after the first passes or delays associated with the last passes before fails. That is, the controller 120 may store delays corresponding to the second boundaries of the data bits DB.

In operation S785, the controller 120 may calculate the pieces of second offset information depending on the delays of the first boundaries and the delays of the second boundaries. Afterwards, as described with reference to FIG. 14, the controller 120 may adjust delays of the input delay circuits 121_1 to 121_8 associated with the nonvolatile memory device 110b depending on the pieces of second offset information.

Figure 21:
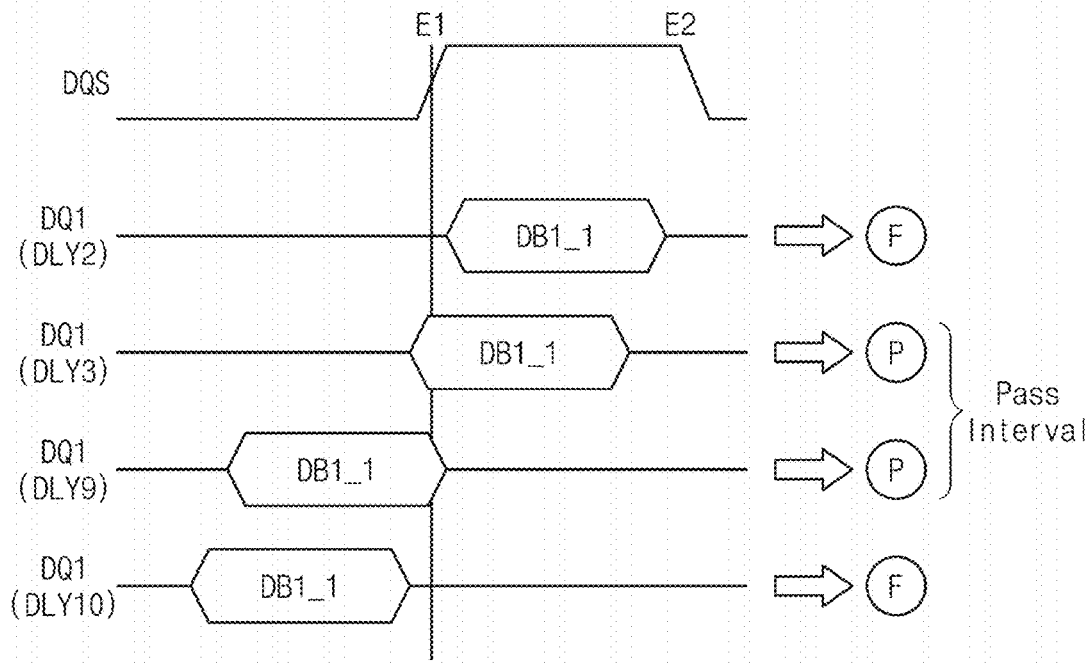
FIG. 21 illustrates an example in which pieces of second offset information are calculated according to a method of FIG. 20.

FIG. 21 illustrates an example in which pieces of second offset information are calculated according to a method of FIG. 20. According to at least one example embodiment of the inventive concepts, FIG. 21 illustrated an example in which a total number of the procedures illustrated in FIG. 19 decreases by applying the pieces of first offset information that were determined by performing the procedures illustrated in FIG. 19. For example, according to at least some example embodiments, once first offset information has been determined with respect to a first memory device, a number of operations needed to determine first offset information with respect to subsequent memory devices may be reduced by utilizing the first offset information determined for the first memory device as a starting point. Referring to FIGS. 1, 2, 17, and 21, with regard to the first data input and output line DQ1, the pieces of first offset information may include the third delay DLY3 as a delay of a first boundary.

The controller 120 may set the second delay DLY2, which is obtained by delaying the third delay DLY3 once more, to an initial delay such that a fail is detected at the first data input and output line DQ1 at first. Afterwards, the controller 120 may repeatedly write and read the bit DB1_1 while adjusting a delay. The controller 120 may detect a first boundary from the bit DB1_1 that has a varying delay and is repeatedly written and read.

As illustrated in FIG. FIG. 21, a fail "F" is caused from the bit DB1_1 that is written in the nonvolatile memory device 110b with the second delay DLY2, and a pass "P" is caused from the bit DB1_1 that is written in the nonvolatile memory device 110b with the third delay DLY3. The controller 120 may determine the first boundary from the bits DB1_1 having the second and third delays DLY2 and DLY3.

That is, if the nonvolatile memory device 110b sets an initial delay based on the pieces of first offset information, the first boundary of the first data input and output line DQ1 is detected by writing and reading the bit DB1_1. In the example described with reference to FIG. 19, compared with the case where the bit DB1_1 is written and read three times until the first boundary is determined, the number of times that the bit DB1_1 is written and read decreases by the pieces of first offset information.

After the first boundary is determined, the controller 120 may adjust delays of the input delay circuits 121_1 to 121_8 to intermediate delays. As illustrated in FIG. 19, with regard to the first data input and output line DQ1, the pieces of first offset information may include the tenth delay DLY10 as a delay of a second boundary. The controller 120 may set the ninth delay DLY9, which is obtained by delaying the tenth delay DLY10 once more, to an intermediate delay such that a pass is detected at the first data input and output line DQ1 at first.

Afterwards, the controller 120 may repeatedly write and read the bit DB1_1 while adjusting a delay. The controller 120 may detect a second boundary from the bit DB1_1 that has a varying delay and is repeatedly written and read. As illustrated in FIG. 21, a pass "P" is caused from the bit DB1_1 that is written in the nonvolatile memory device 110b with the ninth delay DLY9, and a fail "F" is caused from the bit DB1_1 that is written in the nonvolatile memory device 110b with the tenth delay DLY10. The controller 120 may determine the second boundary from the bits DB1_1 having the ninth and tenth delays DLY9 and DLY10.

That is, if the nonvolatile memory device 110b sets an intermediate delay based on the pieces of first offset information, the second boundary of the first data input and output line DQ1 is detected by writing and reading the bit DB1_1 two times. In the example described with reference to FIG. 19, compared with the case where the bit DB1_1 is written and read seven times until the second boundary is determined after the first boundary is determined, the number of times that the bit DB1_1 is written and read decreases by the pieces of first offset information.

The training operation described with reference to FIG. 21 may be equally performed with respect to the remaining data input and output lines DQ2 to DQ8. For example, the training operation may be performed on the data input and output lines DQ1 to DQ8 independently of each other, in parallel, or individually (e.g., simultaneously). Through the training operation, the controller 120 may detect timings of the data bits DB and may detect the pieces of second offset information for aligning data bits.

Figure 22:
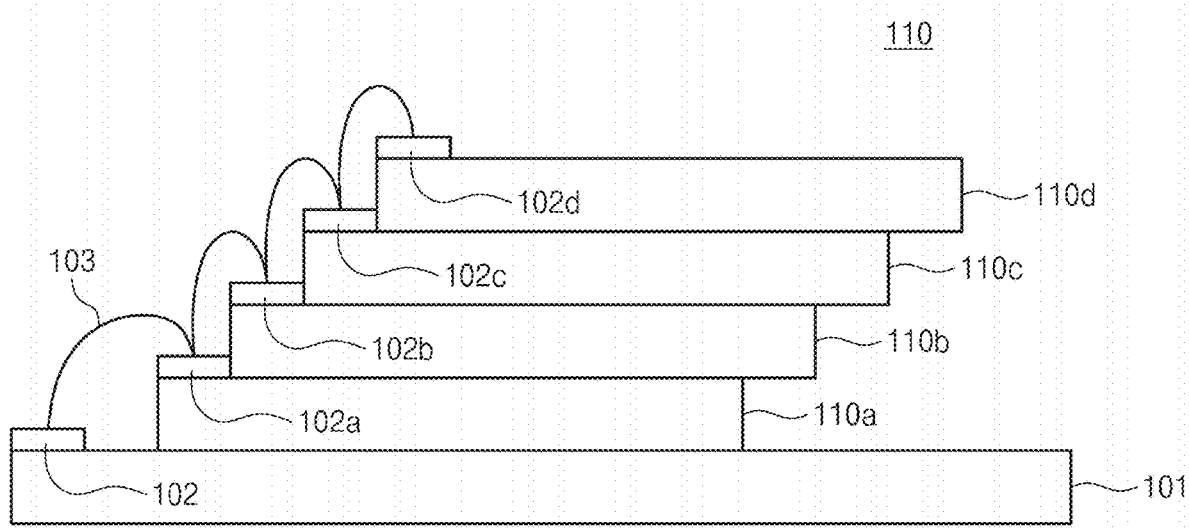
FIG. 22 illustrates an example in which the nonvolatile memory devices form one package.

FIG. 22 illustrates an example in which the nonvolatile memory devices 110a to 110d form one nonvolatile memory package 110. Referring to FIG. 22, the nonvolatile memory package 110 includes a substrate 101 and the nonvolatile memory devices 110a to 110d. A substrate pad 102 may be provided in the substrate 101. The substrate pad 102 may be connected with the nonvolatile memory devices 110a to 110d through wirings 103. The substrate 101 may include internal or external wirings connecting the substrate pad 102 with an external device.

The nonvolatile memory devices 110a to 110d may be stacked in the form of a cascade. The nonvolatile memory devices 110a to 110d include pads 102a to 102d, respectively. The pads 102a to 102d may connect the nonvolatile memory devices 110a to 110d with the substrate pad 102 through the wiring 103.

Referring to FIGS. 1, 2, and 22, the substrate pad 102 may include the data input and output lines DQ1 to DQ8. The substrate pad 102 may be electrically connected with the controller 120. If the nonvolatile memory devices 110a to 110d are stacked, distances on an electrical path between the nonvolatile memory devices 110a to 110d may have directivity.

A distance (a first distance) on the electrical path between the nonvolatile memory device 110a and the controller 120 may be the shortest. A distance (a second distance) on the electrical path between the nonvolatile memory device 110b and the controller 120 may be longer than the first distance. A distance (a third distance) on the electrical path between the nonvolatile memory device 110c and the controller 120 may be longer than the second distance. A distance (a fourth distance) on the electrical path between the nonvolatile memory device 110d and the controller 120 may be longer than the third distance.

A distance on an electrical path may have an influence on a path delay. A representative nonvolatile memory device may be selected according to a distance on an electrical path. For example, the nonvolatile memory device 110a having the shortest distance on an electrical path may be selected as the representative nonvolatile memory device. As another example, the nonvolatile memory device 110d having the longest distance on an electrical path or the nonvolatile memory device 110b or 110c having an intermediate distance on an electrical path may be selected as the representative nonvolatile memory device.

For example, as illustrated in FIG. 22, in the case where distances on an electrical path of the nonvolatile memory devices 110a to 110d uniformly increases or decreases, pieces of second offset information may be used for training of other nonvolatile memory devices. For example, it is assumed that the nonvolatile memory device 110a having the shortest distance on an electrical path is selected as the representative nonvolatile memory device.

Pieces of first offset information may be determined as a result of performing training in the representative nonvolatile memory device 110a, as described with reference to FIG. 10 or 18. Afterwards, the nonvolatile memory device 110b having a distance following the representative nonvolatile memory device 110a may be selected. Training may be performed in the nonvolatile memory device 110b based on pieces of second offset information, as described with reference to FIG. 12 or 20. Pieces of third offset information may be determined as the training result.

The nonvolatile memory device 110c having a distance following the nonvolatile memory device 110b may be selected. Training may be performed in the nonvolatile memory device 110c based on the pieces of third offset information. That is, training may be performed while selecting a nonvolatile memory device such that a distance on an electrical path between the selected nonvolatile memory device and the controller 120 sequentially increases (or decreases). A result of previous training may be used for current training.

Distances on an electrical path between the nonvolatile memory devices 110a to 110z and the controller 120 may vary with a through silicon via (TSV) stack structure, or with lengths of wirings disposed in a printed circuit board (PCB), in addition to the cascade stack structure. A representative nonvolatile memory device may be selected according to a distance on an electrical path.

Figure 23:
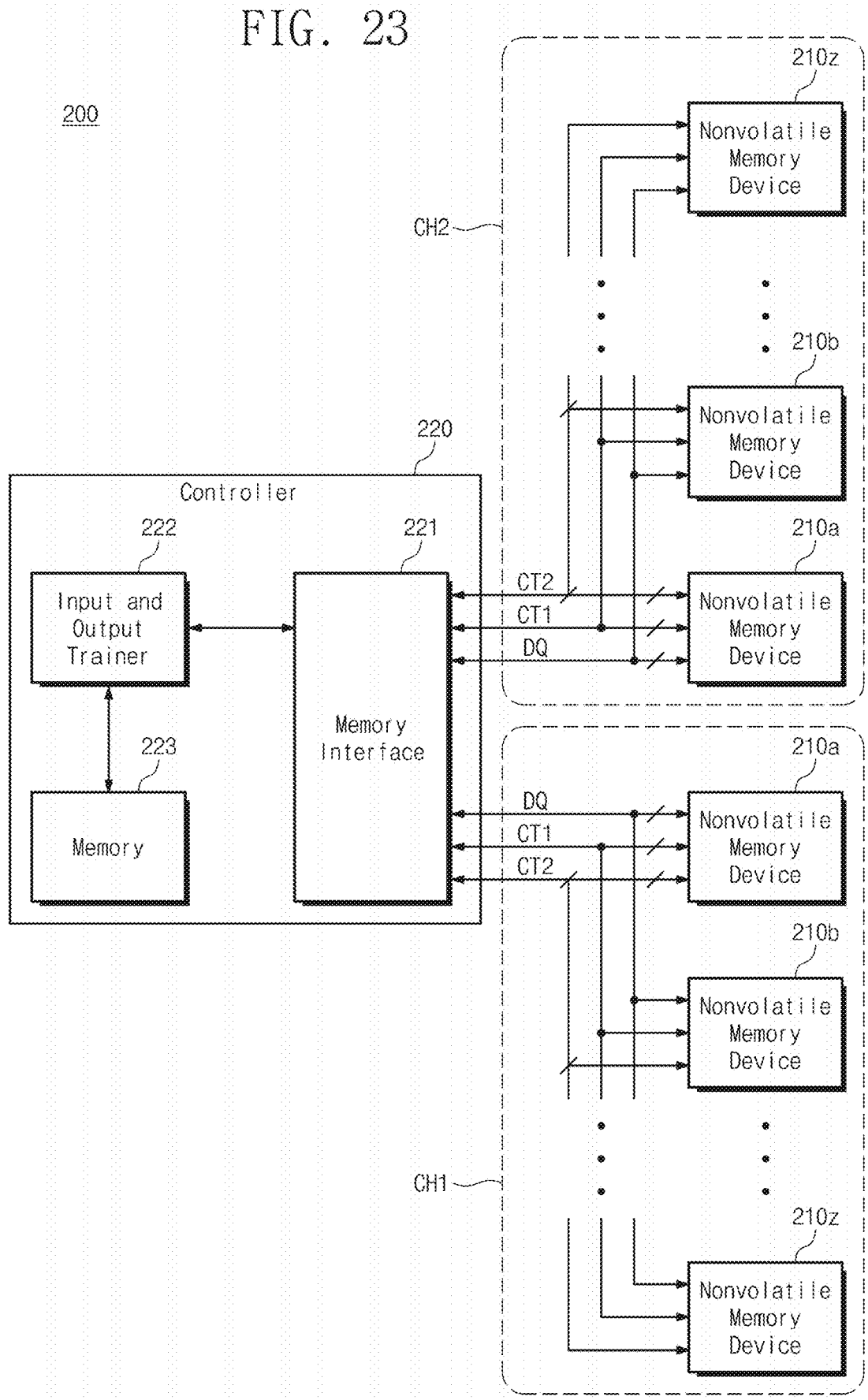
FIG. 23 is a block diagram illustrating the storage device according to at least one example embodiment of the inventive concepts.

FIG. 23 is a block diagram illustrating a storage device 200 according to at least one example embodiment of the inventive concepts. Referring to FIG. 23, the storage device 200 includes nonvolatile memory devices 210a to 210z of a first channel CH1, nonvolatile memory devices 210a to 210z of a second channel CH2, and a controller 220. The controller 220 includes a memory interface 221, an input and output trainer 222, and a memory 223.

The memory interface 221 may control the first channel CH1 and the second channel CH2 independently of each other, individually, or in parallel. The memory interface 221 may simultaneously perform first-step or second-step training in the second channel CH2 while performing first-step or second-step training in the first channel CH1. The memory interface 221 may simultaneously perform training in the second channel CH2 while performing training in the first channel CH1. According to at least some example embodiments of the inventive concepts, the input and output trainer 222 and memory 223 may have the same function as the input and output trainer 122 and memory 123 described above with reference to FIG. 1. The input and output trainer 222 may also be occasionally referred to in the present disclosure as the input and output trainer circuit 222.

According to at least some example embodiments of the inventive concepts, full training is performed on a representative nonvolatile memory device, and partial training is performed on the remaining nonvolatile memory devices by using pieces of offset information of the representative nonvolatile memory device. Accordingly, a training speed is improved through a nonvolatile memory device, a storage device including nonvolatile memory devices, and a method of training data input and output lines between a controller and the nonvolatile memory devices, according to at least some example embodiments of the inventive concepts.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A storage device comprising:
a plurality of nonvolatile memory devices; and
a controller connected to the plurality of nonvolatile memory devices through data lines,
wherein:
the controller is configured to store first offset information by performing a first training operation on a first nonvolatile memory device from among the plurality of nonvolatile memory devices,
the controller is further configured to, based on the first offset information, perform a second training operation on a second nonvolatile memory device from among the plurality of nonvolatile memory devices,
during the first training operation, the controller is configured to output read enable signal to the first nonvolatile memory device through a signal line,
during the first training operation, the first nonvolatile memory device is configured to output data strobe signal to the controller through a data strobe signal line,
during the first training operation, the first nonvolatile memory device is configured to output first data bits to the controller through the data lines in synchronization with the data strobe signal, and
the read enable signal toggles with a certain period during a first time interval and stop toggling with the certain period during a second time interval.

2. The storage device of claim 1, wherein, the controller is further configured to:
perform the first training operation by storing timings of the first data bits respectively received through the data lines from the first nonvolatile memory device with respect to the data strobe signal, and
store the first offset information, the first offset information indicating one or more delays that, if applied by the first nonvolatile memory device to first data transmitted by the first nonvolatile memory device via one of the data lines, resulting in the transmitted first data being received at the controller as valid data.

3. The storage device of claim 2, wherein:
the first nonvolatile memory device includes a plurality delay elements configured to output the first data bits to the data lines,
the controller is further configured to send the first offset information to the first nonvolatile memory device, and
the first nonvolatile memory device is configured to adjust delays of the plurality of delay elements based on the first offset information.

4. The storage device of claim 1, wherein, the controller is further configured to perform the second training operation by:
selecting initial delays based on the first offset information,
controlling the second nonvolatile memory device to set delays of delay elements included in the second nonvolatile memory device to the initial delays, and
storing first boundaries of second data bits received at the controller from the second nonvolatile memory device in accordance with the initial delays.

5. The storage device of claim 4, wherein based on valid information being stored from at least one data bit of the second data bits received in accordance with the initial delays at the controller, the second nonvolatile memory device is configured to readjust at least one initial delay corresponding to the at least one data bit.

6. The storage device of claim 4, wherein, the controller is further configured to perform the second training operation by:
selecting intermediate delays based on the first offset information,
controlling the second nonvolatile memory device to set the delays of the delay elements of the second nonvolatile memory device to the intermediate delays, and
storing second boundaries of the second data bits received at the controller from the second nonvolatile memory device in accordance with the intermediate delays.

7. The storage device of claim 6, wherein based on invalid information being stored from at least one data bit of the second data bits received in accordance with the intermediate delays at the controller, the second nonvolatile memory device is configured to readjust at least one intermediate delay corresponding to the at least one data bit.

8. The storage device of claim 6, wherein:
the controller is further configured to store second offset information based on the second boundaries, and
the second offset information indicates one or more delays that, if applied by the second nonvolatile memory device to second data transmitted by the second nonvolatile memory device via one of the data lines, resulting in the transmitted second data being received at the controller as valid data.

9. The storage device of claim 8, wherein:
the controller is further configured to send the second offset information to the second nonvolatile memory device, and
the second nonvolatile memory device is further configured to adjust the delays of the delay elements of the second nonvolatile memory device based on the second offset information.

10. The storage device of claim 8, wherein the controller is further configured to, based on the second offset information, control a third nonvolatile memory device from among the plurality of nonvolatile memory devices to adjust delays of the delay elements of the third nonvolatile memory device.

11. The storage device of claim 4, wherein the controller is further configured to, based on the first offset information, control the second nonvolatile memory device to adjust the delays of the delay elements of the second nonvolatile memory device.

12. The storage device of claim 1, wherein:
the performing the first training operation includes:
sending second data bits through the data lines to write the second data bits in the first nonvolatile memory device, and
reading the written data bits from the first nonvolatile memory device to store timings of second data bits that the controller sends to the first nonvolatile memory device, and
the first offset information indicates one or more delays that, if applied by the controller to first data transmitted by the controller via one of the data lines, resulting in the transmitted first data being received at the first nonvolatile memory device as valid data.

13. The storage device of claim 1, wherein the controller is further configured to perform the second training operation by,
determining initial delays based on the first offset information,
setting delays of delay elements included in the controller in association with the second nonvolatile memory device to the initial delays,
writing, based on the initial delays, second data bits in the second nonvolatile memory device through the data lines,
reading the written data bits from the second nonvolatile memory device, and
storing first boundaries of the read data bits.

14. The storage device of claim 13, wherein:
the controller is further configured to store intermediate delays based on the first offset information, and
the controller is further configured to perform the second training operation by:
writing the second data bits in the second nonvolatile memory device through the data lines in accordance with the intermediate delays,
reading the written data bits from the second nonvolatile memory device, and
storing second boundaries of the read data bits.

15. The storage device of claim 1, wherein the first nonvolatile memory device is one of:

a nonvolatile memory device, from among the plurality of nonvolatile devices, that is connected to the controller by shortest lines, from among the plurality of data lines, and
a nonvolatile memory device, from among the plurality of nonvolatile devices, that is connected to the controller by the longest line, from among the data lines.

16. The storage device of claim 1, wherein, during the first training operation:
the controller is configured to send a command and information of the first data bits to the first nonvolatile memory device, and
the first nonvolatile memory device is configured to output the first data bits based on the command.

17. The storage device of claim 1, wherein the first training operation is performed after power-on of the storage device.

18. The storage device of claim 1, wherein the data strobe signal has at least a partly same waveform with the read enable signal and is delayed from the read enable signal.

19. A storage device comprising:
a first nonvolatile memory device;
a second nonvolatile memory device; and
a controller connected to the first nonvolatile memory device and the second nonvolatile memory device,
wherein:
the controller is configured to perform a first training operation with the first nonvolatile memory device to store offset information,
the controller is configured to perform a second training operation with the second nonvolatile memory device based on the offset information,
time of the second training operation is shorter than time of the first training operation,
during the first training operation, the controller is configured to output read enable signal to the first nonvolatile memory device,
during the first training operation, the first nonvolatile memory device is configured to output data strobe signal to the controller, and
the read enable signal toggles with a certain period during a first time interval and stop toggling with the certain period during a second time interval.

20. The storage device of claim 19, wherein the data strobe signal has at least a partly same waveform with the read enable signal and is delayed from the read enable signal.

* * * * *